United States Patent
Clark et al.

(10) Patent No.: US 8,599,623 B1
(45) Date of Patent: Dec. 3, 2013

(54) CIRCUITS AND METHODS FOR MEASURING CIRCUIT ELEMENTS IN AN INTEGRATED CIRCUIT DEVICE

(75) Inventors: Lawrence T Clark, Phoenix, AZ (US); Richard S Roy, Dublin, CA (US)

(73) Assignee: Suvolta, Inc., Los Gatos, CA (US)

( * ) Notice: Subject to any disclaimer, the term of this patent is extended or adjusted under 35 U.S.C. 154(b) by 130 days.

(21) Appl. No.: 13/336,434

(22) Filed: Dec. 23, 2011

(51) Int. Cl.
*G11C 7/00* (2006.01)

(52) U.S. Cl.
USPC ........ 365/189.02; 365/201; 365/198; 711/30; 711/718; 711/719

(58) Field of Classification Search
USPC ........ 365/189.02, 201, 198; 711/30, 718, 719
See application file for complete search history.

(56) References Cited

U.S. PATENT DOCUMENTS

| | | |
|---|---|---|
| 3,958,266 A | 5/1976 | Athanas |
| 4,000,504 A | 12/1976 | Berger |
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |

(Continued)

FOREIGN PATENT DOCUMENTS

| | | |
|---|---|---|
| EP | 0274278 A1 | 7/1988 |
| EP | 0312237 A2 | 4/1989 |

(Continued)

OTHER PUBLICATIONS

Banerjee et al., "Compensating Non-Optical Effects using Electrically-Driven Optical Proximity Correction", Proc. of SPIE, vol. 7275, 2009.

(Continued)

*Primary Examiner* — Connie Yoha

(57) ABSTRACT

An integrated circuit device can include a plurality of test elements, each comprising at least one first switch coupled between a node within a tested section and an intermediate node, a test switch coupled between the intermediate node and a forced voltage node, and a second switch coupled between the intermediate node and an output node; wherein the forced voltage node is coupled to receive a forced voltage substantially the same as a test voltage applied to the output node in a test mode.

31 Claims, 12 Drawing Sheets

(56) References Cited

U.S. PATENT DOCUMENTS

| | | |
|---|---|---|
| 5,373,186 A | 12/1994 | Schubert et al. |
| 5,384,476 A | 1/1995 | Nishizawa et al. |
| 5,426,328 A | 6/1995 | Yilmaz et al. |
| 5,438,270 A * | 8/1995 | Harper et al. ............ 324/429 |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,841,716 A | 11/1998 | Iwaki |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farrenkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin |
| 5,985,705 A | 11/1999 | Seliskar |
| 5,989,963 A | 11/1999 | Luning et al. |
| 5,999,466 A | 12/1999 | Marr et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,160,746 A | 12/2000 | Park et al. |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,249,468 B1 | 6/2001 | Kan et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,560,141 B2 | 5/2003 | Osada et al. |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jachne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,192 B1 * | 7/2005 | Xin-LeBlanc et al. .... 324/76.53 |

(56) References Cited

U.S. PATENT DOCUMENTS

| | | |
|---|---|---|
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,333,379 B2 | 2/2008 | Ramadurai et al. |
| 7,348,629 B2 | 3/2008 | Chu et al. |
| 7,354,833 B2 | 4/2008 | Liaw |
| 7,380,225 B2 | 5/2008 | Joshi et al. |
| 7,385,864 B2 | 6/2008 | Loh et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,474,132 B2 | 1/2009 | Cheng |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Hemer et al. |
| 7,888,747 B2 | 2/2011 | Hokazono |

(56) References Cited

U.S. PATENT DOCUMENTS

| | | |
|---|---|---|
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren et al. |
| 2011/0294278 A1 | 12/2011 | Eguchi et al. |

(56) References Cited

U.S. PATENT DOCUMENTS

| | | | |
|---|---|---|---|
| 2011/0309447 | A1 | 12/2011 | Arghavani et al. |
| 2012/0021594 | A1 | 1/2012 | Gurtej et al. |
| 2012/0034745 | A1 | 2/2012 | Colombeau et al. |
| 2012/0065920 | A1 | 3/2012 | Nagumo et al. |
| 2012/0108050 | A1 | 5/2012 | Chen et al. |
| 2012/0132998 | A1 | 5/2012 | Kwon et al. |
| 2012/0138953 | A1 | 6/2012 | Cai et al. |
| 2012/0146155 | A1 | 6/2012 | Hoentschel et al. |
| 2012/0167025 | A1 | 6/2012 | Gillespie et al. |
| 2012/0187491 | A1 | 7/2012 | Zhu et al. |
| 2012/0190177 | A1 | 7/2012 | Kim et al. |
| 2012/0223363 | A1 | 9/2012 | Kronholz et al. |

FOREIGN PATENT DOCUMENTS

| | | |
|---|---|---|
| EP | 0531621 A2 | 3/1993 |
| EP | 0683515 A1 | 11/1995 |
| EP | 0889502 A2 | 1/1999 |
| EP | 1450394 A1 | 8/2004 |
| JP | 59193066 A1 | 1/1984 |
| JP | 4186774 A1 | 3/1992 |
| JP | 8288508 A1 | 1/1996 |
| JP | 8153873 A1 | 6/1996 |
| JP | 2004087671 A1 | 3/2004 |
| KR | 10-0794094 B1 | 7/2003 |
| WO | 2011062788 A1 | 5/2011 |

OTHER PUBLICATIONS

Cheng et al., "Extremely Thin SOI (ETSOI) CMOS with Record Low Variability for Low Power System-on-Chip Applications", IEDM 2009, Dec. 2009.

Cheng et al., "Fully Depleted Extremely Thin SOI Technology Fabricated by a Novel Integration Scheme Featuring Implant-Free, Zero-Silicon-Loss, and Faceted Raised Source/Drain", 2009 Symposium on VLSI Technology Digest of Technical Papers, 2009.

Drennan et al., "Implications of Proximity Effects for Analog Design", Custom Integrated Circuits Conference, 2006, CICC '06, IEEE, Sep. 10-13, 2006, pp. 169-176.

Hook et al., "Lateral Ion Implant Straggle and Mask Proximity Effect", IEEE Transactions on Electron Devices, vol. 50, No. 9, Sep. 2003.

Hori et al., "A 0.1 um CMOS with a Step Channel Profile Formed by Ultra High Vacuum CVD and In-Situ Doped Ions", IEDM 1993, May 12, 1993.

Matsuhashi et al., "High-Performance Double-Layer Epitaxial-Channel PMOSFET Compatible with a Single Gate CMOSFET", 1996 Symposium on VLSI Technology Digest of Technical Papers, 1996.

Shao et al., "Boron diffusion in silicon: the anomalies and control by point defect engineering", Materials Science and Engineering R 42 (2003), Nov. 2003, pp. 65-114.

Sheu et al., "Modeling the Well-Edge Proximity Effect in Highly Scaled MOSFETs", IEEE Transactions on Electron Devices, vol. 53, No. 11, Nov. 2006, pp. 2792-2798.

English Abstract of JP2004087671 submitted herewith.
English Abstract of JP4186774 submitted herewith.
English Abstract of JP59193066 submitted herewith.
English Abstract of JP8153873 submitted herewith.
English Abstract of JP8288508 submitted herewith.
English Translation of JP8288508 submitted herewith.

Abiko, H et al., "A Channel Engineering Combined with Channel Epitaxy Optimization and TED Suppression for 0.15 µm n-n Gate CMOS Technology", 1995 Symposium on VLSI Technology Digest of Technical Papers, 1995, pp. 23-24.

Chau, R et al., "A 50nm Depleted-Substrate CMOS Transistor (DST)", Electron Device Meeting 2001, IEDM Technical Digest, IEEE International, 2001, pp. 29.1.1-29.1.4.

Ducroquet, F et al. "Fully Depleted Silicon-On-Insulator nMOSFETs with Tensile Strained High Carbon Content Si1-yCy Channel", 2006, ECS 210th Meeting, Abstract 1033.

Ernst, T et al., "Nanoscaled MOSFET Transistors on Strained Si, SiGe, Ge Layers: Some Integration and Electrical Properties Features", 2006, ECS Trans. 2006, vol. 3, Issue 7, pp. 947-961.

Goesele, U et al., Diffusion Engineering by Carbon in Silicon, 2000, Mat. Res. Soc. Symp. vol. 610.

Hokazono, A et al., "Steep Channel & Halo Profiles Utilizing Boron-Diffusion-Barrier Layers (Si:C) for 32 nm Node and Beyond", 2008, 2008 Symposium on VLSI Technology Digest of Technical Papers, pp. 112-113.

Hokazono, A et al., "Steep Channel Profiles in n/pMOS Controlled by Boron-Doped Si:C Layers for Continual Bulk-CMOS Scaling", 2009, IEDM09-676 Symposium, pp. 29.1.1-29.1.4.

Holland, OW and Thomas, DK "A Method to Improve Activation of Implanted Dopants in SiC", 2001, Oak Ridge National Laboratory, Oak Ridge, TN.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", 1996, IEDM 96, pp. 459-462.

Lavéant, P. "Incorporation, Diffusion and Agglomeration of Carbon in Silicon", 2002, Solid State Phenomena, vols. 82-84, pp. 189-194.

Noda, K et al., "A 0.1-µm Delta-Doped MOSFET Fabricated with Post-Low-Energy Implanting Selective Epitaxy", Apr. 1998, IEEE Transactions on Electron Devices, vol. 45, No. 4, pp. 809-814.

Ohguro, T et al., "An 0.18-µm CMOS for Mixed Digital and Analog Aplications with Zero-Volt-Vth Epitaxial-Channel MOSFET's", Jul. 1999, IEEE Transactions on Electron Devices, vol. 46, No. 7, pp. 1378-1383.

Pinacho, R et al., "Carbon in Silicon: Modeling of Diffusion and Clustering Mechanisms", Aug. 2002, Journal of Applied Physics, vol. 92, No. 3, pp. 1582-1588.

Robertson, LS et al., "The Effect of Impurities on Diffusion and Activation of Ion Implanted Boron in Silicon", 2000, Mat. Res. Soc. Symp. vol. 610.

Scholz, R et al., "Carbon-Induced Undersaturation of Silicon Self-Interstitials", Jan. 1998, Appl. Phys. Lett. 72(2), pp. 200-202.

Scholz, RF et al., "The Contribution of Vacancies to Carbon Out-Diffusion in Silicon", Jan. 1999, Appl. Phys. Lett., vol. 74, No. 3, pp. 392-394.

Stolk, PA et al., "Physical Mechanisms of Transient Enhanced Dopant Diffusion in Ion-Implanted Silicon", May 1997, J. Appl. Phys. 81(9), pp. 6031-6050.

Thompson, S et al., "MOS Scaling: Transistor Challenges for the 21st Century", 1998, Intel Technology Journal Q3' 1998, pp. 1-19.

Wann, C. et al., "Channel Profile Optimization and Device Design for Low-Power High-Performance Dynamic-Threshold MOSFET", 1996, IEDM 96, pp. 113-116.

Werner, P et al., "Carbon Diffusion in Silicon", Oct. 1998, Applied Physics Letters, vol. 73, No. 17, pp. 2465-2467.

Yan, Ran-Hong et al., "Scaling the Si MOSFET: From Bulk to SOI to Bulk", Jul. 1992, IEEE Transactions on Electron Devices, vol. 39, No. 7.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., Integrating Intrinsic Parameter Fluctuation Description into BSIMSOI to Forecast sub-15 nm UTB SOI based 6T SRAM Operation, Solid-State Electronics (50), pp. 86-93.

Wong, H et al., "Nanoscale CMOS", Proceedings of the IEEE, Vo. 87, No. 4, pp. 537-570.

Machine Translation of KR 10-0794094 Submitted herewith.

* cited by examiner

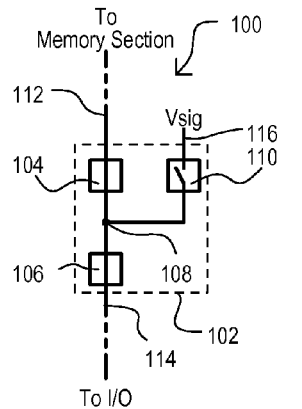
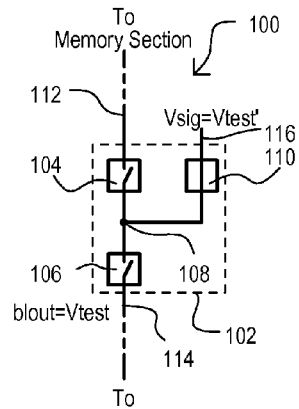
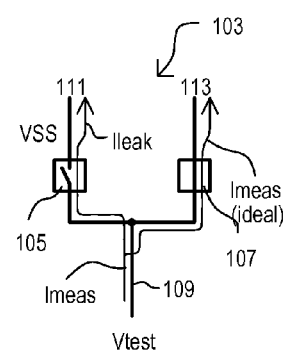
FIG. 1A  FIG. 1B  FIG. 2 (BACKGROUND)
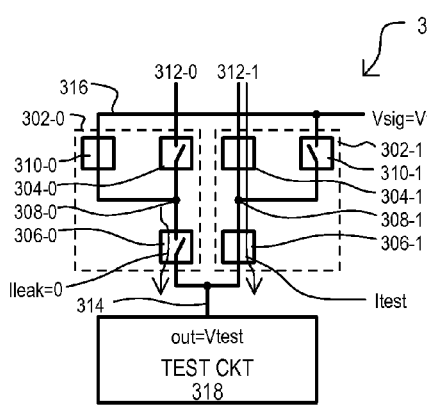
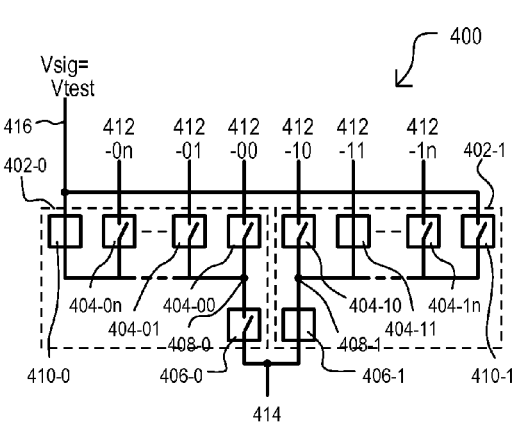
FIG. 3  FIG. 4
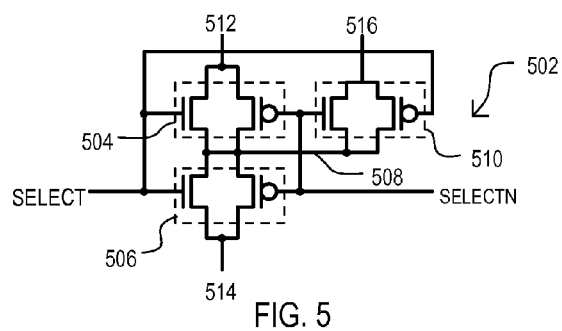
FIG. 5

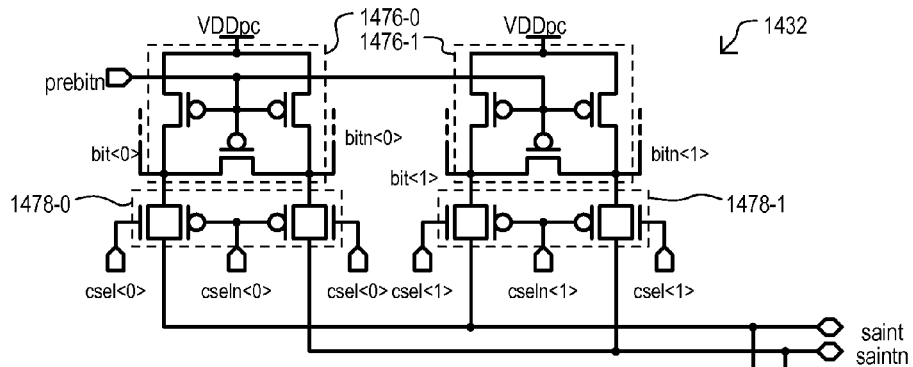
FIG. 14
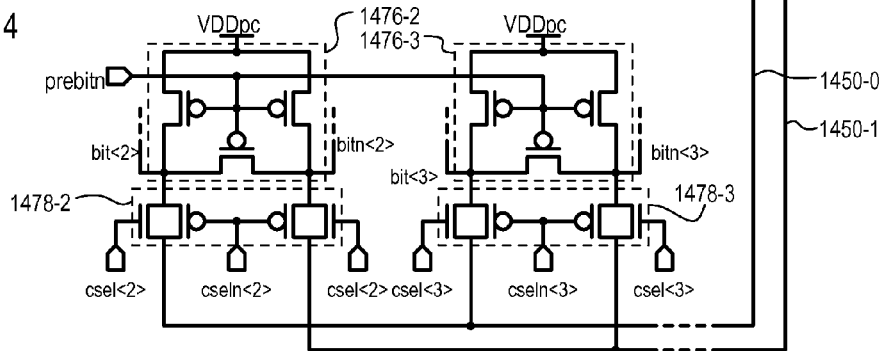
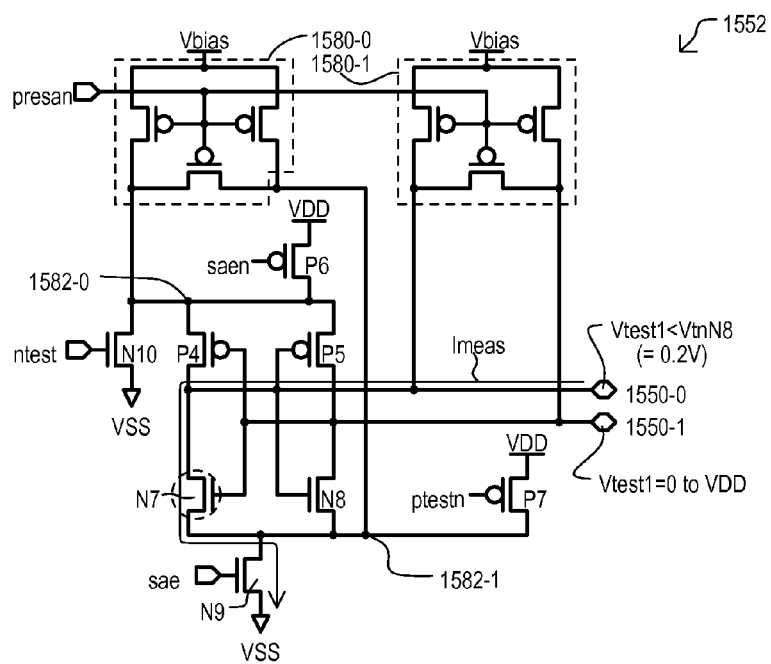
FIG. 15A
DSTAN

DSTAP

OFFSET

|  | Read | Write | DBTA | DSTAN | DSTAP | Offset |
|---|---|---|---|---|---|---|
| sae | 0/1 | 0 | 0 | 1 | 0 | 0/1 |
| saen | 1/0 | 1 | 1 | 1 | 0 | 1/0 |
| ntest | 0 | 0 | 1 | 1 | 0 | 0 |
| ptestn | 1 | 1 | 0 | 1 | 0 | 1 |
| presan | 0/1 | 0/1 | 1 | 1 | 1 | 1 |
| prebitn | 0/1 | 0/1 | 1 | 1 | 1 | 1 |
| csel | 0/1 | 0 | 1 | 0 | 0 | 0 |
| dbsel | 0 | 0 | 1 | 1 | 1 | 1 |
| renable | 0/1 | 0 | 0 | 0 | 0 | 0/1 |
| wenalbe | 0 | 0/1 | 0 | 0 | 0 | 0 |

CIRCUITS AND METHODS FOR MEASURING CIRCUIT ELEMENTS IN AN INTEGRATED CIRCUIT DEVICE

TECHNICAL FIELD

The present invention relates generally to integrated circuit devices, and more particularly to test circuits for integrated circuit devices for characterizing transistors therein.

BACKGROUND

Integrated circuit devices can include circuit sections, such as memory circuits, that can be designed for high performance operations. Memory circuits, such as static random access memory (SRAMs) typically have a number of memory cells arranged into one or more arrays composed of multiple transistors. The performance characteristics and yield of the circuit sections in the integrated circuit can be affected by variations in the electrical characteristics of the transistors, such as threshold voltages, current drive, etc., and circuit characteristics, such as offset voltages.

While it is desirable to test transistor characteristics and circuit characteristics within memory cells and other circuit sections of the integrated circuit, data input/output (I/O) paths can introduce leakage currents that can make it very difficult to achieve high fidelity measurements.

BRIEF DESCRIPTION OF THE DRAWINGS

FIGS. 1A and 1B are block schematic diagrams showing an integrated circuit device according to an embodiment.

FIG. 2 is a block schematic diagram of a conventional MUX.

FIG. 3 is a block schematic diagram of an integrated circuit device according to another embodiment.

FIG. 4 is a block schematic diagram of an integrated circuit device according to a further embodiment.

FIG. 5 is a schematic diagram of a test element according to an embodiment.

FIG. 14 is a schematic diagram of a column select MUX/ precharge circuit that can be included in embodiments.

FIGS. 15A to 15C are schematic diagrams showing the testing of a sense amplifier circuit according to an embodiment.

DETAILED DESCRIPTION

Figure 6A:
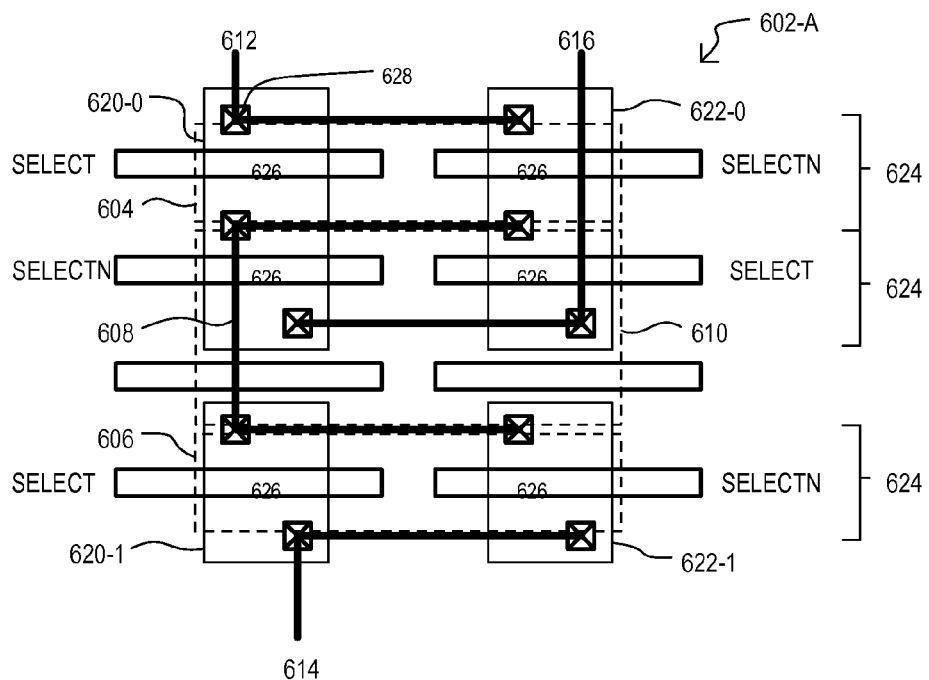
FIGS. 6A and 6B are layouts for a test element according to embodiments.

Various embodiments will now be described in detail with reference to a number of drawings. The embodiments show integrated circuit device test circuits and methods that can reduce leakage currents in a data input/output (I/O) path and thereby enable accurate testing (including characterization) of circuit elements within the device.

In the various embodiments below, like items are referred to by the same reference character but the leading digits corresponding to the figure number.

Referring now to FIGS. 1A and 1B, an integrated circuit (IC) device 100 according to an embodiment is shown in a block schematic diagram. An IC device 100 can include one or more test elements 102. A test element 102 can provide a data path to enable signals to travel to a section of the device (in the embodiment shown a memory section). In addition, a test element 102 can enable low current leakage test paths to enable testing (including characterization) of elements within the section. A test element 102 can include a first switch 104, a second switch 106, and a test switch 110. A first switch 104 can be coupled between a section node 112 and an intermediate node 108. A second switch 106 can be coupled between intermediate node 108 and an output node 114. A test switch 110 can be coupled between intermediate node 108 and a forced voltage node 116. One or more test elements 102 can be used to couple input and output data signals, e.g., test signals, to a circuit under test within the integrated circuit 100. For example, the test element 102 can be used to enable testing and characterization of component transistors or sub-circuits of analog circuit sections in an integrated circuit device, such as a flash analog to digital converter, as well as logic and memory sections.

In some embodiments, a section node 112 can be a node within a memory section of an integrated circuit device. For example, a section node 112 can include any of: a bit line or transistor gate, source, or drain within a selected memory cell. In addition or alternatively, a section node 112 can include nodes within circuits positioned between a memory cell array and input/outputs (I/Os) of a memory section. For example, a memory section node 112 can include any of: a sense amplifier circuit sense node, a transistor within a sense amplifier circuit, or switching circuits in an I/O path (e.g. column multiplexer, column select signals, etc.). It is noted that there can be intervening circuits between a section node 112 and a test element 102. It is also noted that while node 114 is referred to as an "output" node, it can serve to input data to a memory section in some embodiments.

A test element 102 can have two modes of operation, a standard mode and a low leakage cutoff mode. FIG. 1A shows a test element 102 in a standard mode. In a standard mode, first and second switches (104, 106) can be configured to provide a low impedance path, while test switch 110 can be configured to provide a high impedance path. Consequently, a signal path can be enabled between memory section node 112 and output node 114. At the same time, forced voltage node 116 can be isolated from intermediate node 108.

FIG. 1B shows a test element 102 in a low leakage cutoff mode. In a low leakage cutoff mode, first and second switches (104, 106) can be configured to provide a high impedance path. However, a test switch 110 can be configured into a low impedance state. Output node 114 can be driven to a test voltage Vtest, while forced voltage node 116 can be driven to a voltage Vtest', which can be the same as Vtest, or substantially the same. In such an arrangement, output node 114 and intermediate node 108 can be driven to the same, or substantially the same voltage. Accordingly, there may be little or no leakage current flowing through second switch 106. The low leakage cutoff mode can be advantageously used to reduce leakage current and thereby enable high fidelity measurements when many test elements 102 are coupled to a section node 112, as the test elements 102 that are configured to provide a high impedance path may contribute little or no leakage current to the section node 112. In one embodiment, the forced voltage node 116 can be driven to substantially the same voltage as the output node 114 using a voltage follower circuit. The test element 102 can be advantageously used to perform high fidelity measurement for transistors, circuits, or test sections that are internal to an integrated circuit, as explained in detail below with reference to measurements performed for integrated circuits having static random access memory (SRAM) circuits.

The arrangement of FIG. 1B is in contrast to a conventional MUX shown in FIG. 2. A conventional MUX 103 can include switches 105, 107 in parallel between a common output node 109 and different input nodes 111, 113, respectively. If a test is conducted through switch 107, even if the other switch 105 is in an off state (i.e., configured to provide a high impedance path), because input node 111 is de-asserted (i.e., at a voltage VSS that is different than a voltage Vtest at output node 109), leakage current (Ileak) can flow through switch 105, contributing to error in a measured current Imeas. This leakage current can have a significant effect on the fidelity of measurements when many switches are connected to the same node, as the leakage current flowing through each switch in the off state contributes to the error in the measured current Imeas.

Referring back to FIGS. 1A and 1B, an output node 114 can be a node internal to an IC device 100. For example, an output node 114 can be a conductive connection between test element 102 and testing circuits formed on a same IC, such as built-in self-test (BIST) circuits. In addition or alternatively, an output node 114 can be an external connection to an IC device 100. For example, an output node 114 can include a physical connection to IC device 100 (e.g., pads, leads, pins, landing, balls, circuit board traces, etc.). In such cases, an external test device (wafer probe, automatic test equipment, etc.) can apply test conditions to test element 102. It is noted that there may be intervening circuits between a test element 102 and an output node 114.

FIG. 3 shows how test elements can be used to lower leakage current in a low leakage cutoff mode of operation, and thereby improve the accuracy of measurements performed on sections of the integrated circuit. FIG. 3 shows an integrated circuit device 300 having two test elements 302-0/1. Such test elements 302-0/1 can have the same structure as test element 102 in FIGS. 1A/B.

FIG. 3 shows test elements 302-0/1 in a test mode of operation. It is assumed that test conditions are being applied to section node 312-1 via test element 302-1, while test element 302-0 serves to isolate its section node 312-0 from any testing. As shown, test element 302-1 is in a standard mode (as in FIG. 1A), enabling a signal path between section node 312-1 and output node 314. In the particular embodiment shown, a test current Itest flows while a voltage Vtest is applied to output node 314.

In contrast, test element 302-0 is in the low leakage cutoff mode. A voltage Vsig, which can be the same as, or substantially the same as Vtest, can be applied to intermediate node 308-0 through test switch 310-0. Consequently, there can be little or no leakage current (Ileak=0) flowing to output node 314 from test element 302-0 to interfere with current Imeas.

FIG. 3 also shows a test circuit 318 coupled to output node 314. A test circuit 318 can apply a test voltage to an output node 314. In the embodiment shown, a test circuit 318 can include a current measuring circuit that can measure Itest. Further, a test circuit 318 can also generate Vsig for application to forced voltage node 316. A test circuit 318 can be a testing device separate from an IC device 300 (e.g., a tester), which can make contact to external connections to an IC. In addition or alternatively, a test circuit 318 can be formed, all or in part, in a same integrated circuit package or substrate (i.e., is part of IC device 300).

While FIGS. 1A/B and 3 have shown test elements with one first switch and one test switch, alternate embodiments can include multiple first switches per one test switch. One such embodiment is shown in FIG. 4.

FIG. 4 shows two test elements 402-0/1 in an arrangement like that of FIG. 3. However, each test element 402-0/1 includes n+1 first switches (404-00 to -0n, 404-10 to -1n). In FIG. 4, test element 402-0 is in a low leakage cutoff mode. In the low leakage cutoff mode, a test switch 410-0 can be conductive (in a low impedance state), applying a test voltage (Vtest) to the intermediate node 408-0. At the same time, all first switches (412-00 to -0n) and the second switch 406-0 can be non-conductive (in a high impedance state).

In FIG. 4, test element 402-1 is in a standard mode. In the standard mode, test switch 410-1 can be non-conductive. At the same time, one of the first switches, e.g., switch 404-11, can be conductive, while the remaining first switches (404-10 and -404-12 to -1n) can be non-conductive. Second switch 406-1 can also be conductive.

Output node 414 can be driven with a voltage that is the same, or substantially the same, as voltage Vtest at intermediate node 408-0.

Test elements according to embodiments shown herein can be formed with any circuit elements suitable for achieving desired reductions in leakage current at an output node. Some embodiments can form test elements with transistors appropriate to the manufacturing process. In particular embodiments, test elements can be formed with insulated gate field effect transistors (e.g., MOS transistors).

FIG. 5 is a schematic diagram of a test element 502 according to one embodiment. Test element 502 can have the configuration shown in FIGS. 1A/B, and in a very particular embodiment, can be one implementation of test element 102 shown in FIGS. 1A/B.

In FIG. 5, first switch 504, second switch 506 and test switch 510 can be formed from complementary MOS (CMOS) passgates, each including complementary conductivity (i.e., n-channel and p-channel) transistors arranged in parallel with one another. Gates of the transistors can be driven with complementary control signals SELECT/SELECTN. Accordingly, when signals SELECT/SELECTN are high/low, respectively, test element 502 can be in a standard mode, first and second switches (504/506) can be conductive, and test switch 510 can be non-conductive. When signals SELECT/SELECTN are low/high, respectively, test element 502 can be in a low leakage cutoff mode, with first and second switches (504/506) being non-conductive, and test switch 510 being conductive. Therefore, in the low leakage cutoff mode, when the voltage at forced voltage node 516 is driven to substantially the same voltage as the output node 514, the test switch 510 can enable driving of the intermediate node 508 with substantially the same voltage as the output node 514.

In one embodiment, signals SELECT/SELECTN can be boosted voltage signals in a test mode. For example, in a non-boosted mode, SELECT can be driven to a high power supply voltage (VDD) and SELECTN can be driven to a low power supply voltage (e.g., VSS). However, in a test mode of operation, signal SELECT can be driven to boosted voltage (e.g., VPP>VDD). In addition or alternatively, signal SELECTN can be driven to a boosted voltage (e.g., VBB<VSS). Such boosted signal levels can enable lower impedance when switches are conductive, and less leakage when switches are non-conductive, as compared to the non-boosted mode of operation.

It is understood that while FIG. 5 shows a test element having switches (504, 506, 510) controlled by a common signal pair, alternate embodiments can control such elements separately.

It is also noted that in an alternate embodiment, any of switches 504, 506, or 510 can be formed by one transistor, rather than as CMOS pass gates, which can receive boosted signals at its gate.

In designing IC devices, is desirable to utilize as little substrate area as possible to increase economies of scale and/or reduce signal routing lengths. Compact area implementations of test elements will now be described.

FIG. 6A is a top plan view of showing a layout of a test element 602-A according to an embodiment. FIG. 6A shows first active regions 620-0/1, in which n-channel transistors can be formed, and second active regions 622-0/1, in which p-channel transistors can be formed. Gate structures 626 for transistors are also shown. Interconnect structures are shown by bold lines. Contact structures (one shown as 628) can provide conductive connections from interconnects to a substrate.

FIG. 6A shows a test element 602-A like that of FIG. 5, having a first switch 604, a second switch 606, and a test switch 610 formed with complementary transistor types. Applied signals (SELECT/SELECTN) are shown next to their corresponding gate structures 626. As shown, a test element 602-A can be implemented with three transistor pitches 624, for a compact design.

Figure 6B:
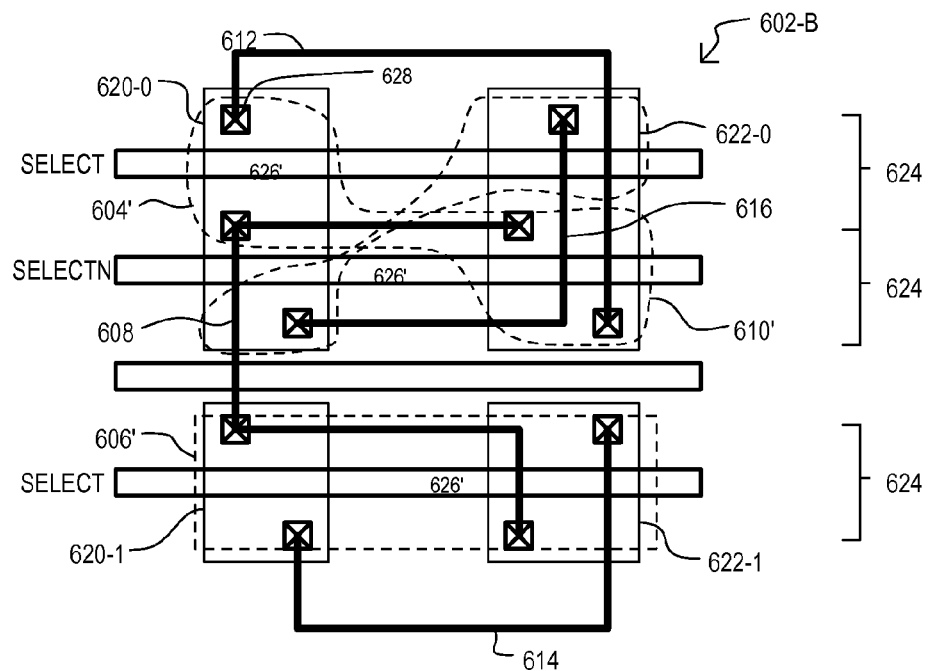

FIG. 6B is a top plan view of showing another layout of a test element 602-B according to an embodiment. FIG. 6B shows items like that of FIG. 6A. However, FIG. 6B differs from FIG. 6A in that gate structures 626' can be common to transistors of different conductivity type, enabling a simpler routing of signals.

Figure 7:
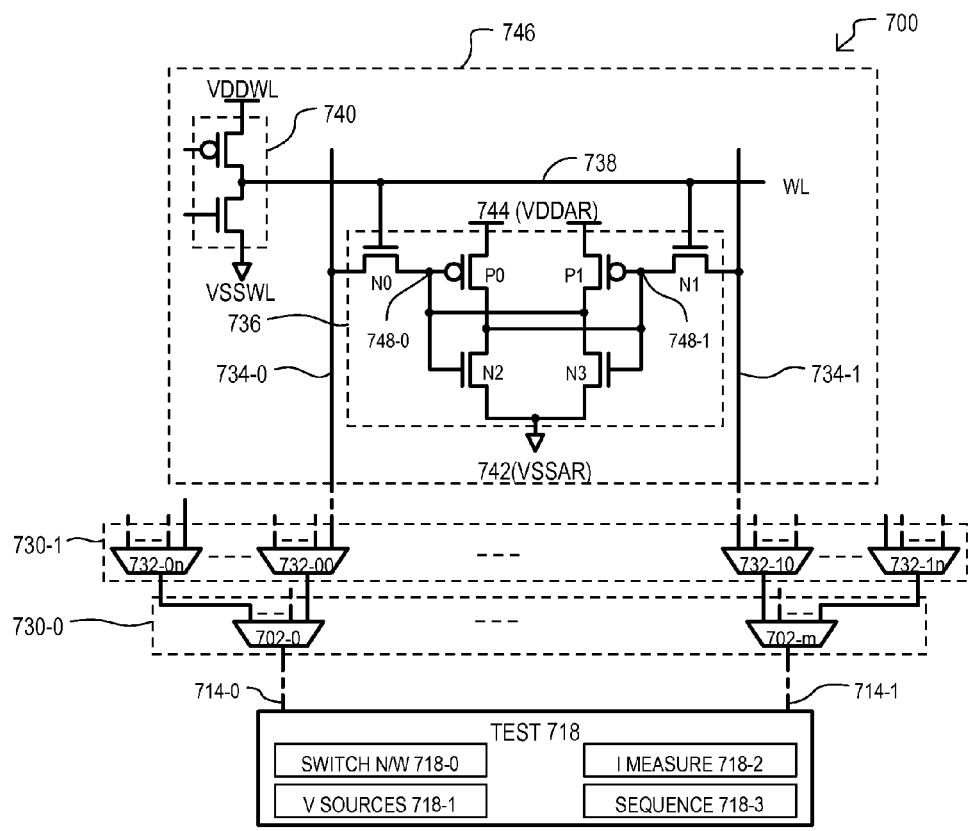
FIG. 7 shows an integrated circuit device with a sense amplifier according to an embodiment.

Referring now to FIG. 7, an integrated circuit device 700 according to another embodiment is shown in block schematic diagram. An IC device 700 can include a first MUX layer 730-0, a second MUX layer 730-1, and a memory section 746. A test circuit 718 is also shown that may, or may not, be part of IC device 700.

A first MUX layer 730-0 can include multiple test elements 702-0 to -m, each of which can take the form of any of the test elements shown herein, or equivalents. Each of test elements 702-0/1 can be coupled to an output node 714-0/1, which is coupled to, or which can be coupled to, test circuit 718.

A second MUX layer 730-1 can include a number of column MUXes 732-00 to 732-1n. Column MUXes can selectively couple bit lines (two shown as 734-0/1) of a memory section 746 to first MUX layer 730-0. In some embodiments, column MUXes (732-00 to -1n) can include test elements as described herein, or equivalents. However, in other embodiments, column MUXes (732-00 to -1n) can include conventional MUX circuits.

It is understood that first and second MUX layers (730-0 and 730-1) can enable signal paths in response to column select data, which can be generated from a memory address, or the like.

In the embodiment shown, a memory section 746 can include bit line pairs (one shown as 734-0/1) coupled to a number of memory cells (one shown as 736). Memory cells 736 can be coupled to a corresponding bit line pair 734-0/1 by operation of a word line 738 driven by a word line driver 740. In the particular embodiment shown, a memory cell 736 can be a six-transistor (6T) static random access memory (SRAM) cell, having two p-channel transistors P0/P1 cross-coupled between storage nodes 748-0/1, two n-channel transistors N2/N3 cross-coupled between storage nodes 748-0/1, and two access transistors N0/N1 that can couple storage nodes 748-0/1 to bit lines 734-0/1. Memory cells (e.g., 736) can be coupled between a high array power supply voltage node 744 and a low array power supply voltage node 742.

A word line driver 740 can drive a word line 738 between a high voltage VDDWL and a low voltage VSSWL. A voltage VDDWL can be substantially higher than a high array supply voltage VDDAR, and VSSWL can be substantially lower than VSSAR. A boosted low voltage VSSWL can force access transistors N0/N1 to very low leakage states. A boosted high voltage VDDWL can eliminate any voltage threshold drop across access transistors N0/N1, and place such transistors into very low impedance states to improve current/voltage readings in test operations.

A test circuit 718 can include a switch network 718-0, voltage sources 718-1, a current measuring circuit 718-2, and a sequencer 718-3. A switch network 718-0 can couple test output nodes 714-0/1 to various sections within test circuit 718. Voltage sources 718-1 can provide various test voltages for application to output nodes 714-0/1. Such test voltages can be constant voltages, variable voltages (e.g., a sweep over a range), or differential voltages for application between a pair of output nodes 714-0/1. A current measuring circuit 718-2 can measure a current flowing through an output node 714-0/1. A sequencer 718-3 can execute a test sequence by applying test voltages, and optionally control signals to the device 700. The sequencer 718-3 can also execute test sequences that include generating addresses for the memory section 746 that enable accesses to a selected cell in the memory section 746, and thereby enable the execution of test sequences and the application of test voltages to the selected cell.

In a standard mode of operation, all test elements 702-0 to -m can be placed in a standard mode of operation, enabling read and/or write paths to memory cells 736 via bit lines.

In a test mode of operation, two of test elements 702-0 to -m can be placed in a standard mode of operation, while remaining test elements can be placed in the low leakage cutoff mode. The two test elements in the standard mode can enable test circuit 718 to apply test conditions to memory section 746. Test conditions according to particular embodiments will be described in more detail below.

Figure 8:
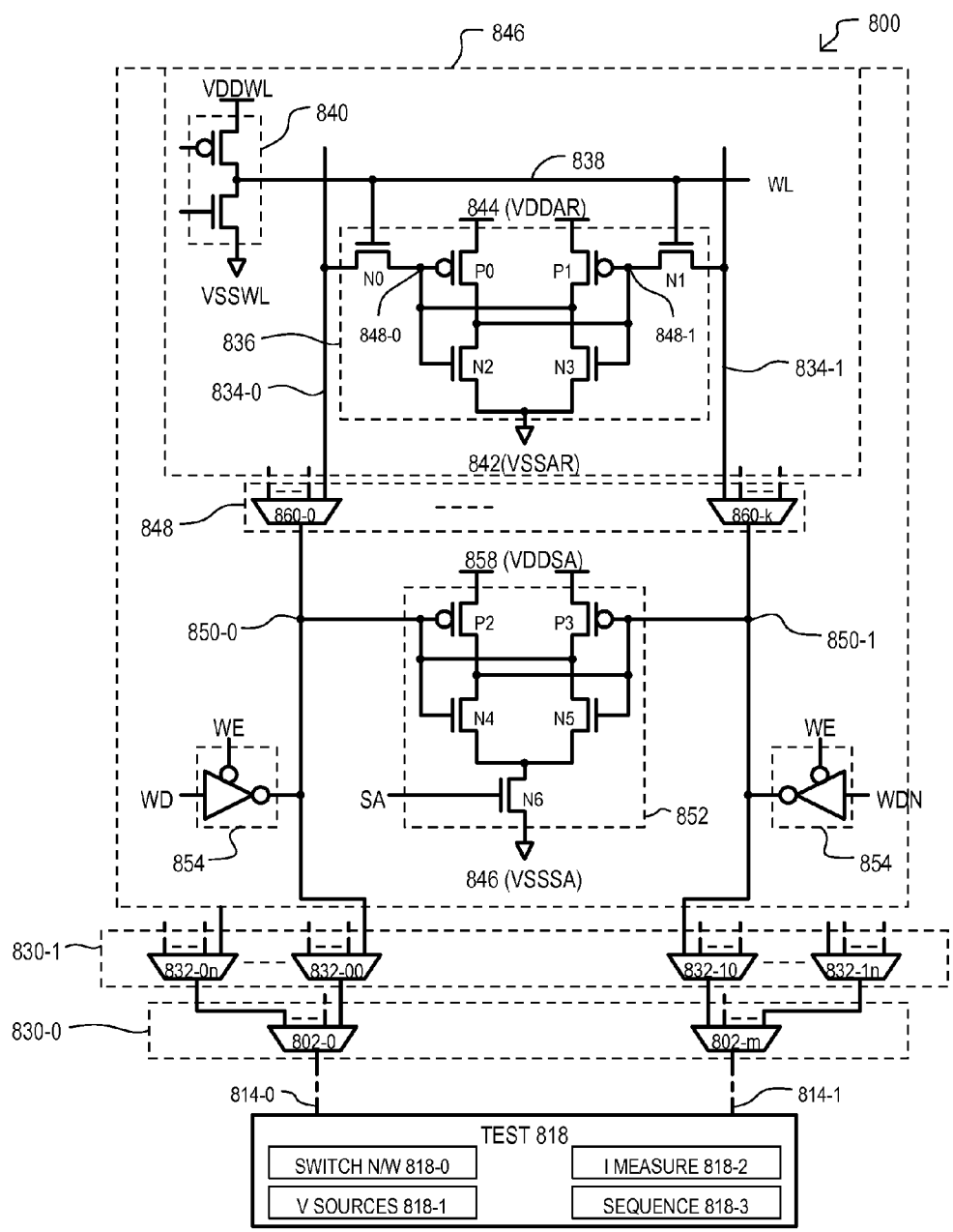
FIG. 8 shows an integrated circuit device with a sense amplifier isolated from bit lines with column select circuits according to an embodiment.

Referring now to FIG. 8, an integrated circuit device 800 according to another embodiment is shown in block schematic diagram. An IC device 800 can include sections like FIG. 7. FIG. 8 differs from FIG. 7 in that a column select layer 848 and a sense amplifier 852 can be included between bit lines 834-0/1 and second MUX layer 830-1.

A column select layer 848 can include column select circuits 860-0 to -k that couple bit lines (e.g., 834-0/1) to MUX layers (830-0/1) based on column select values.

While embodiments can include various types of sense amplifiers, in the particular embodiment of FIG. 8, sense amplifier 852 can include two p-channel sense transistors P2/P3 cross coupled between sense node 850-0/1, two n-channel sense transistors N4/N5 cross-coupled between sense nodes 848-0/1, and an enable transistor N6. Sense amplifier 852 can be coupled between a high sense amplifier supply voltage VDDSA and a low sense amplifier supply voltage VSSSA.

FIG. 8 also shows a write driver 854 which can drive sense nodes 850-0/1 with complementary write data WD/WDN during a write operation to a memory cell 836. Alternative embodiments can have other write driver configurations to drive the sense nodes during a write operation to the memory cell, e.g., the write drivers can be placed at the inputs of the column select circuits 860-0 to -k.

In an arrangement like that of FIG. 8, a sense amplifier 852 can also be tested through test elements 802-00 to -1n. When testing a sense amplifier 852, a column select layer 848 can be driven to a high impedance state to isolate a sense amplifier 852 from bit lines 834-0/1. Sense amplifier test conditions according to particular embodiments will be described in more detail below.

Figure 9:
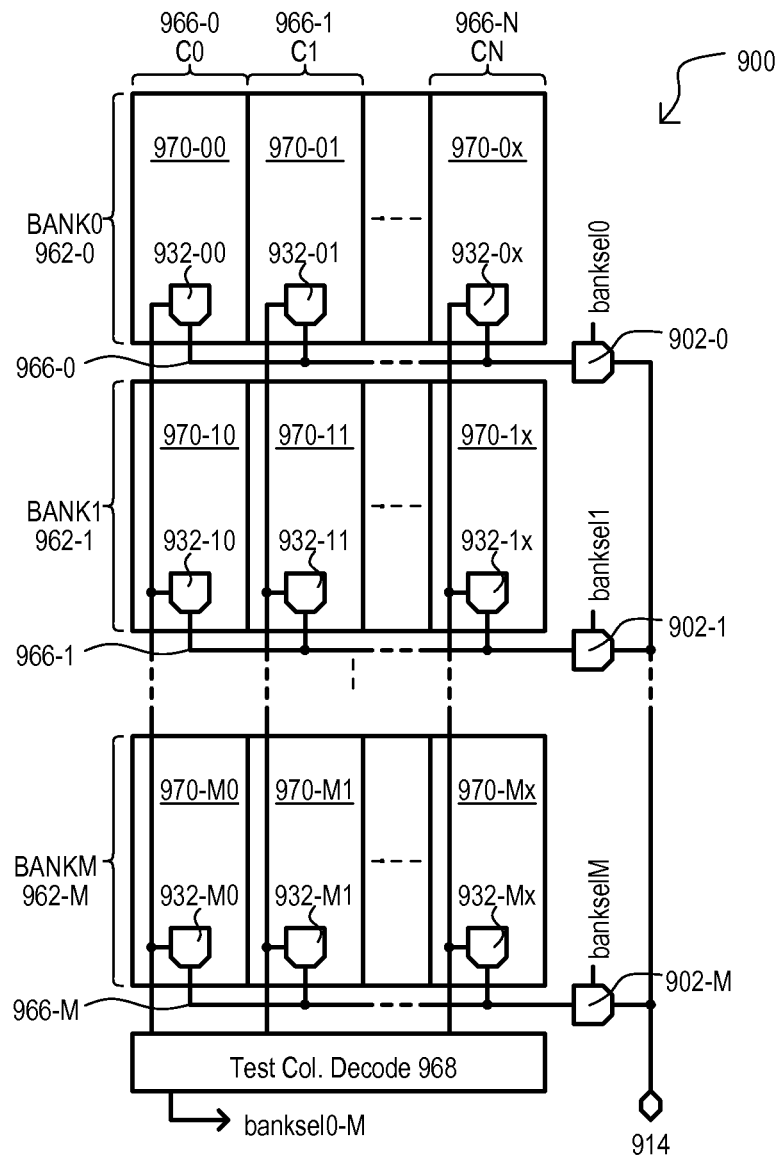
FIG. 9 is a plan view of an integrated circuit device having memory arrays arranged into blocks according to an embodiment.

Embodiments of the invention can include memory sections having memory cells organized into banks. One such embodiment is shown in FIG. 9. Referring to FIG. 9, an integrated circuit device 900 can include a number of banks 962-0 to -M. Each bank (962-0 to -M) can include columns 966-0 to -N. Each column (966-0 to -N) within a bank can be coupled to a bank I/O node 966-0 to -M by column MUXes 932-00 to -Mx. Bank I/O nodes (966-0 to -M) can be coupled to output node 914 by bank selectors 902-0 to -M. Any of column MUXes (932-00 to -Mx) and/or bank selectors (902-0 to -M) can include test elements as described herein, or equivalents A test column decoder 968 can enable and disable test elements within column MUXes (932-00 to -Mx) and/or bank selectors (902-0 to -M) to enable test modes of operation.

Accordingly, circuit elements within any of the banks can be tested as described herein, or equivalents.

Figure 10:
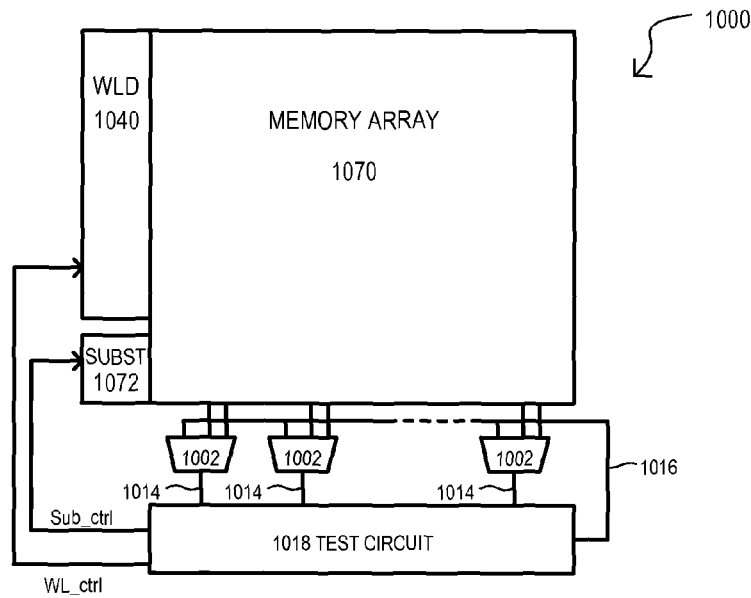
FIG. 10 is a block schematic diagram of a memory device according to an embodiment.

FIG. 10 shows an integrated circuit device 1000 according to another embodiment. FIG. 10 shows a memory device having a memory array 1070, word line drivers 1040, and a substrate control circuit 1072. Test elements 1002 can be included to selectively provide low leakage current test paths between nodes in memory array as described herein and equivalents. A memory array 1070 can include a number of memory cells arranged into rows and columns, accessible through test elements 1002 (and, optionally, additional circuits such as column MUXes). In one embodiment, a memory array 1070 can include SRAM cells, in particular 6T SRAM cells. Word line drivers 1040 can drive word lines to select particular memory cells (e.g., couple memory cells to bit lines in memory array 1070). A substrate control circuit 1072 can vary a substrate bias applied to memory cells of memory array 1070 during certain tests.

A test circuit 1018 can apply test conditions to a memory array 1070 and derive test results from memory array 1070 through test elements 1002. In the embodiment shown, a test circuit 1018 can also control word line driver 1040 and substrate control circuit 1072. As noted above, a test circuit 1018 may, or may not, be part of IC device 1000.

Having described IC devices with test elements that can enable accurate testing of circuit devices, particular test operations according to embodiments will now be described.

FIGS. 11A to 11D show testing of a 6T SRAM cell like that shown in FIGS. 7 and 8. FIGS. 11A to 11D show a memory cell 1136 and test elements 1102-0 to -3.

Figure 11A:
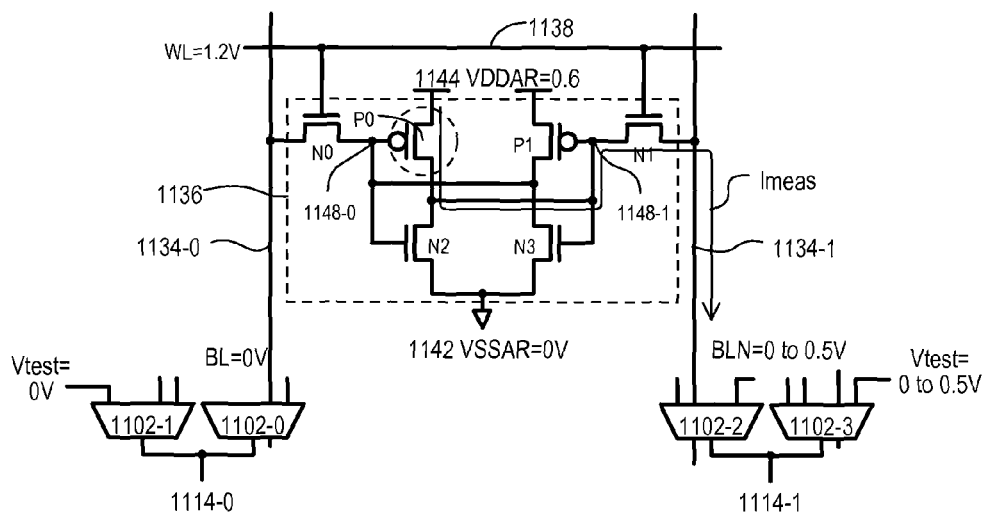
FIGS. 11A to 11D are block schematic diagrams showing the testing of transistors within memory cells according to embodiments.

FIG. 11A shows a test operation with a p-channel load transistor P0 being the transistor under test (TUT). In the testing operation, transistor N2 can be forced off, and bias voltages can be applied to TUT P0 that result in a current flowing through P0 and access transistor N1 to bit line 1134-1.

In the test operation, a word line 1138 can be driven to a level that enables pass transistors N0/N1. Such a word line voltage can be substantially higher than an array high supply voltage VDDAR. In the particular embodiment shown, a word line 1138 can be driven to 1.2V while VDDAR=0.6V.

A first test voltage can be applied to a gate of TUT P0 through test element 1102-0 and access transistor N0. Thus, test element 1102-0 can be in a standard state, allowing a signal path to output node 1114-0. In contrast, any test elements (i.e., 1102-1) coupled to the same output node 1114-0 can be in a low leakage cutoff mode, thus an intermediate node within such test elements can be driven to a voltage that can match that at output node 1114-0. In the particular embodiment shown, bit line 1134-0 can be driven to 0V, thus non-selected test element 1102-1 can apply 0V to its intermediate node.

A second "sweeping" test voltage can be applied to a drain of TUT P0 through test element 1102-2 and access device N1. Thus, test element 1102-2 can be in a standard mode while test element (i.e., 1102-3) coupled to the same output node 1114-1 can be in a low leakage cutoff mode. A sweeping voltage can vary over time, enabling multiple current (Imeas) values to be acquired. Non-selected test element 1102-3 can apply substantially the same sweeping voltage to its internal node. In the particular embodiment shown, bit line 1134-1 can be swept between 0V and 0.5V, and a resulting current (Imeas) can be measured at various points, thus providing an accurate characterization of TUT P0.

It is understood that the other p-channel load transistor P1 can be tested in the same fashion as P0 by swapping the test voltages applied to the bit lines.

Figure 11B:
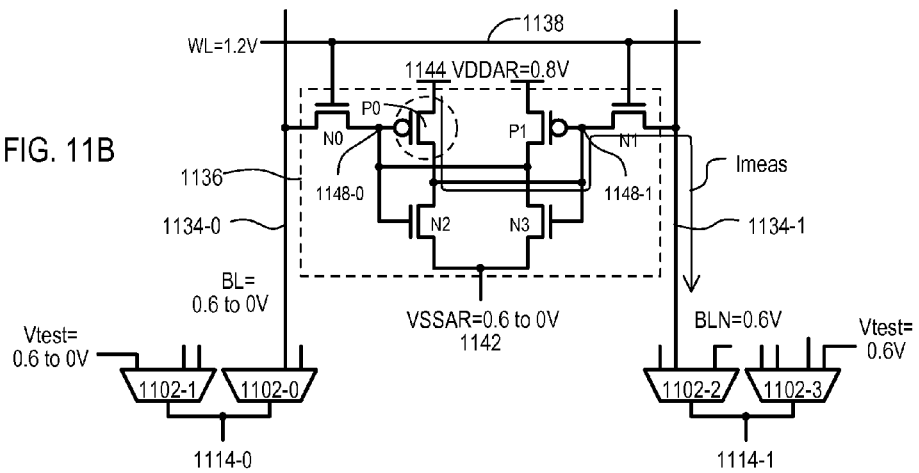

FIG. 11B shows an alternate test operation for P0 as the TUT. In the testing operation, transistor N2 and N3 can be forced off, and bias voltages can be applied to TUT P0 that result in a current flowing through P0 and N1 to bit line 1134-1.

In the test operation, a word line 1138 can be driven as in FIG. 11A. However, in the embodiment shown an array high supply voltage VDDAR can be 0.8V.

A first sweeping voltage can be applied to a gate of TUT P0 through test element 1102-0 and access transistor N0. In addition, a low array power supply voltage VSSAR can be swept in the same fashion. Selected test element 1102-0 can be in a standard state, while non-selected test elements (e.g., 1102-1) coupled to a same output node 1114-0 can be in a low leakage cutoff mode, and receive the same, or substantially same sweeping voltage. In the embodiment shown, a sweeping voltage can be between 0.6 and 0 V.

A second test voltage can be applied to a drain of TUT P0 through test element 1102-2 and access device N1. Selected test element 1102-2 can be in a standard mode and non-selected test elements (i.e., 1102-3) can be in a low leakage cutoff mode and receive substantially the same voltage. In the particular embodiment shown, bit line 1134-1 can receive 0.6V.

Current (Imeas) through bit line 1134-1 can be measured to provide accurate characterization of TUT P0.

It is understood that the other p-channel load transistor P1 can be tested in the same fashion as P0 by swapping the test voltages applied to the bit lines.

Figure 11C:
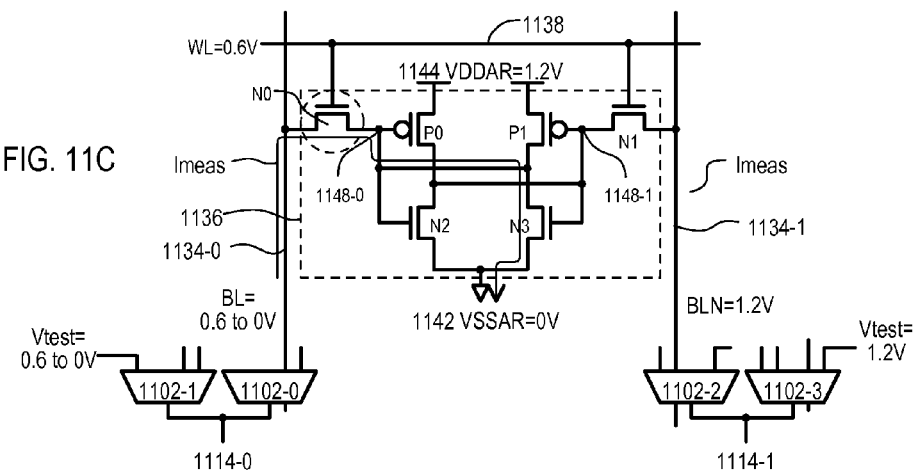

FIG. 11C shows another test operation with access transistor N0 as the TUT. In the testing operation, transistor N2 and P1 can be forced off, and bias voltages can be applied to TUT N0 that result in a current flowing through N0 and N3 from bit line 1134-0.

In the test operation, a word line 1138 can be driven to a test level which gives a desired current response based on the drain-source voltage (VDS) applied to TUT N0. In the particular embodiment shown, a word line 1138 can be driven to 0.6V. An array high supply voltage VDDAR can be 1.2V.

A first sweeping voltage can be applied to a drain of transistor N0 by way of bit line 1134-0. A selected test element 1102-0 can be in a standard state, while non-selected test elements (e.g., 1102-1) can be coupled to receive the same, or substantially the same, sweeping voltage. In the embodiment shown, a sweeping voltage can be between 0.6 and 0 V.

A second test voltage can be applied to a gate of transistor N3 to ensure N3 provides a current path to VSSAR for TUT N0. Selected test element 1102-2 can be in a standard mode and non-selected test elements (i.e., 1102-3) can be in a low leakage cutoff mode. In the particular embodiment shown, bit line 1134-1 and non-selected test element 1102-3 can receive 1.2V.

Current (Imeas) through bit line 1134-0 can be measured to provide accurate characterization of TUT N0.

It is understood that the other access transistor N1 can be tested in the same fashion as N0 by swapping the test voltages applied to the bit lines.

Figure 11D:
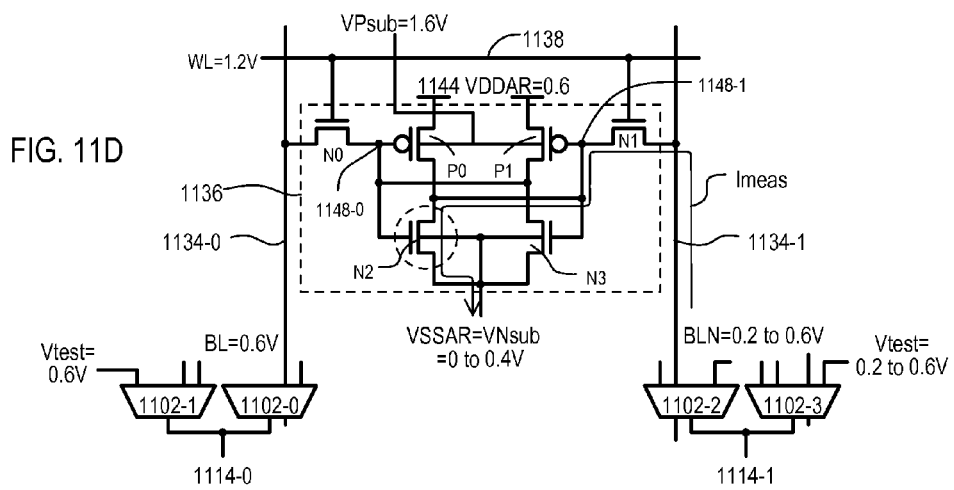

FIG. 11D shows another test operation with n-channel pull-down transistor N2 as the TUT. In the testing operation, transistor P0 can be forced off, and bias voltages can be applied to TUT N2 that result in a current flowing through N2 and N1 from bit line 1134-1.

In the test operation, a word line 1138 can be driven to a test level that enables access transistors N0/N1. In the particular embodiment shown, a word line 1138 can be driven to 1.2V. An array high supply voltage VDDAR can be 0.6V. A substrate voltage for transistors P0/1 (VPsub) can be driven to 1.6V.

A first test voltage can be applied to a gate of transistor N2 through access transistor N0. Selected test element 1102-0 can be in a standard mode, while non-selected test elements (e.g., 1102-1) can be in the low leakage cutoff mode.

A second sweeping test voltage can be applied to a drain of transistor N2 through access transistor N1 to generate a current Imeas that varies according to the VDS of TUT N2. In the particular embodiment shown, such sweeping voltage can be between 0.2 and 0.6 V.

It is noted that body biases (VNsub) can be applied to the TUT (e.g., N2/N3) to raise threshold voltages of such devices. This can reduce unwanted currents in the memory cell 1136. In the particular embodiment shown, such biases can be between 0 and 0.4 V.

It is understood that the other n-channel pull-down transistor N3 can be tested in the same fashion as N2 by swapping the test voltages applied to the bit lines.

It is noted that in the testing operations shown in FIGS. 11A to 11D, it may be desirable to first place the memory cell 1136 into a desired state (e.g., set storage nodes 1148-0/1 to desired complementary states) with a write operation prior to the test operation.

Figure 12:
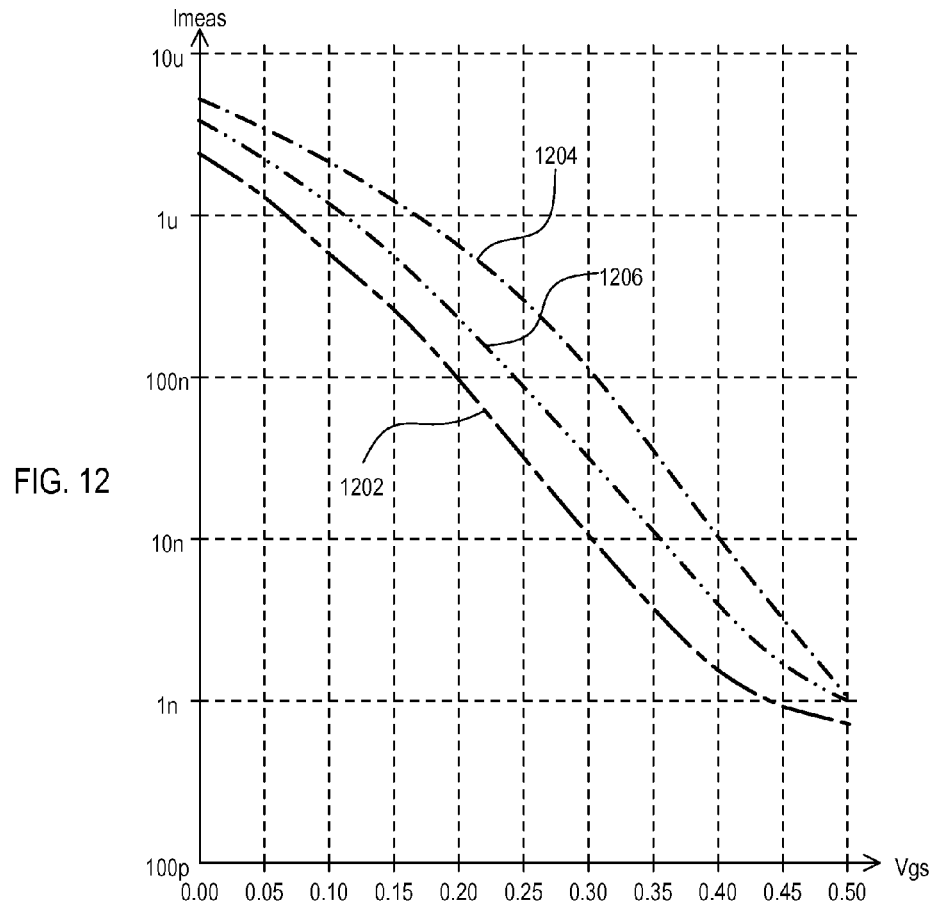
FIG. 12 is a graph showing measurement results for memory cell transistors according to an embodiment.

Test operations such as those described herein can result in high fidelity characterization of transistors within a tested portion of an IC device. In some embodiments, current accuracy can be within 1% using appropriate biasing conditions. FIG. 12 shows particular measurements for an operation like that shown in FIG. 11C or 11D.

FIG. 12 is a graph showing a measured current (Imeas) versus a gate-to-source voltage (Vgs). A measured current (Imeas) can be a current measured from a test output coupled to multiple test elements, like those shown in FIG. 5. Curve 1206 shows responses for transistors having a nominal threshold voltage (Vt=Vtnom). Curve 1202 shows a response for a transistor having a threshold voltage that is 50 mV higher than a nominal value (Vt=Vtnom+50 mV). Curve 1204 shows a response for a transistor having a threshold voltage that is 50 mV lower than a nominal value (Vt=Vtnom−50 mV). As shown, such small variations in threshold voltage are clearly distinguishable by the test results.

It is noted that a threshold voltage (Vt) can be value established according to well understood techniques. For example, a threshold voltage can be a Vgs at which a drain-to-source current (IDS) has a predetermined value for a given drain-to-source voltage (VDS).

As noted above, while embodiments having memory sections can test transistors within memory cells, for some architectures (e.g., FIG. 8) it can be possible to test transistors within sense amplifiers of the memory section. One such embodiment is shown in FIG. 13.

Figure 13:
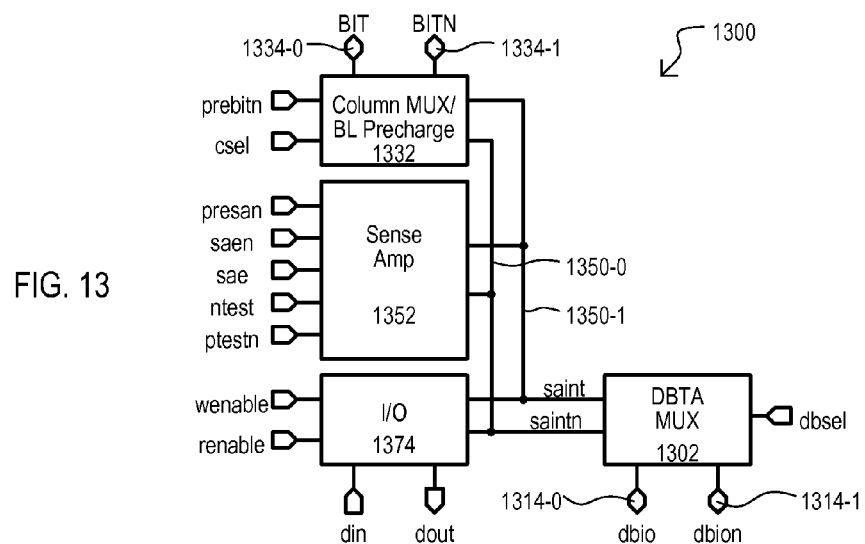
FIG. 13 is a block schematic diagram of an integrated circuit device according to an embodiment.

Referring now to FIG. 13, an IC device 1300 according to another embodiment is shown in a block schematic diagram. The IC device 1300 can include a column MUX/precharge section 1332, a sense amplifier 1352, and I/O section 1374, and test section 1302.

A column MUX/precharge section 1332 can be coupled between bit lines (BIT/BITN) and sense nodes 1350-0/1. In response to a precharge signal (prebitn), column MUX/precharge section 1332 can precharge bit lines (BIT/BITN) to a precharge potential. In response to column select data (csel), column MUX/precharge section 1332 can couple a bit line pair (BIT/BITN) to sense nodes 1350-0/1.

A sense amplifier (SA) 1352 can sense a data value on a selected bit line pair (BIT/BITN). In a sense operation, prior to sensing a data value, sense nodes 1350-0/1 can be precharged to a SA precharge voltage by activation of SA precharge signal (presan). When sensing a data value, bit line precharge circuits in 1332 can be disabled. A memory cell can be coupled to a bit line pair (BIT/BITN), and the bit line pair coupled to sense nodes 1350-0/1 by operation of column MUX/precharge section 1332. According to a data value stored in the memory cell, a differential voltage can develop across a bit line pair (BIT/BITN), and hence across sense nodes 1350-0/1. When sense amplifier enable signals (sae/saen) are activated, the sense nodes 1350-0/1 can be driven to opposing voltages based on the differential voltage.

Unlike a conventional sense amplifier, SA 1352 of FIG. 13 can also receive test signals (ntest/ptestn), which can disable portions of SA 1352 to enable transistors in other portions to be tested. Particular examples of such operations will be described in more detail below.

An I/O section 1374 can output data (dout) based on potentials across sense nodes 1350-0/1, or can drive data on sense nodes 1350-0/1 in response to input data (din). In particular, in response to an active read enable signal (renable), a data output (dout) will be driven based on a potential between sense nodes 1350-0/1. In response to an active write enable signal (wenable), sense nodes 1350-0/1 will be driven to different voltages according to an input data value (din).

A test section 1302 can include test elements as described herein, or equivalents. Such test elements can be enabled in response to a test enable signal (dbsel). When enabled, test voltages can be driven on outputs 1314-0/1 and/or current flowing through outputs 1314-0/1 can be measured. Further, signal paths for such test values can be very low leakage signals paths as described above.

Referring to FIG. 14, a column MUX/precharge section 1432 that can be included in embodiments is shown in a block schematic diagram. In one embodiment, the column MUX/precharge section 1332 (FIG. 13) can be implemented using the column MUX/precharge section 1432.

A column MUX/precharge section 1432 can include bit line precharge circuits 1476-0 to -3 and column select circuits 1478-0 to -3, each of which can be coupled to a corresponding bit line pair bit<n>, bitn<n> (where n=0 to 3). In response to an active precharge signal prebitn, precharge circuits (1476-0 to -3) can precharge their respective bit lines bit<n>/bitn<n> to a precharge voltage VDDpc. In response to particular column select signals csel<n>, cseln<n> (where n=0 to 3), a column select circuit (1476-0 to -3) can couple its bit line pair to sense nodes 1450-0/1.

Figure 15B:
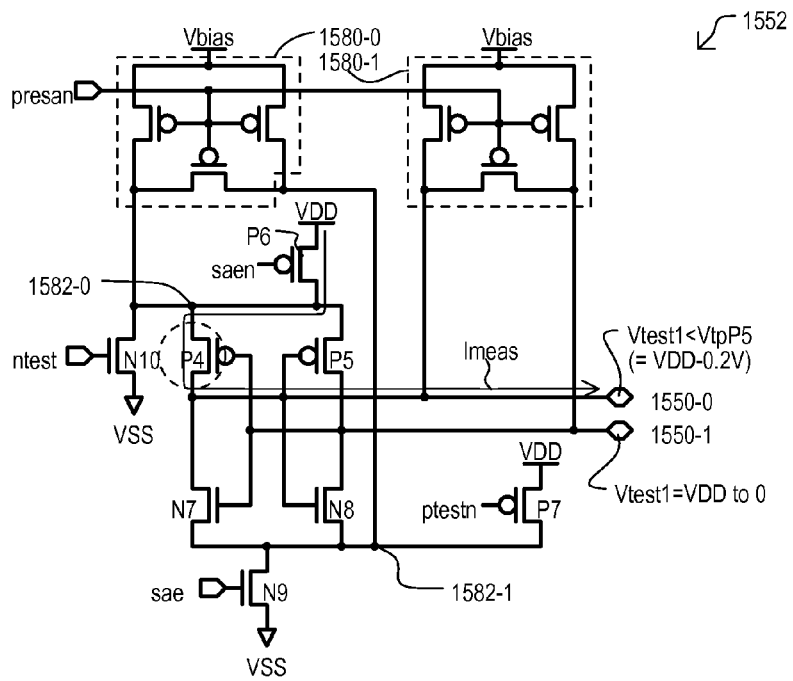
Figure 15C:
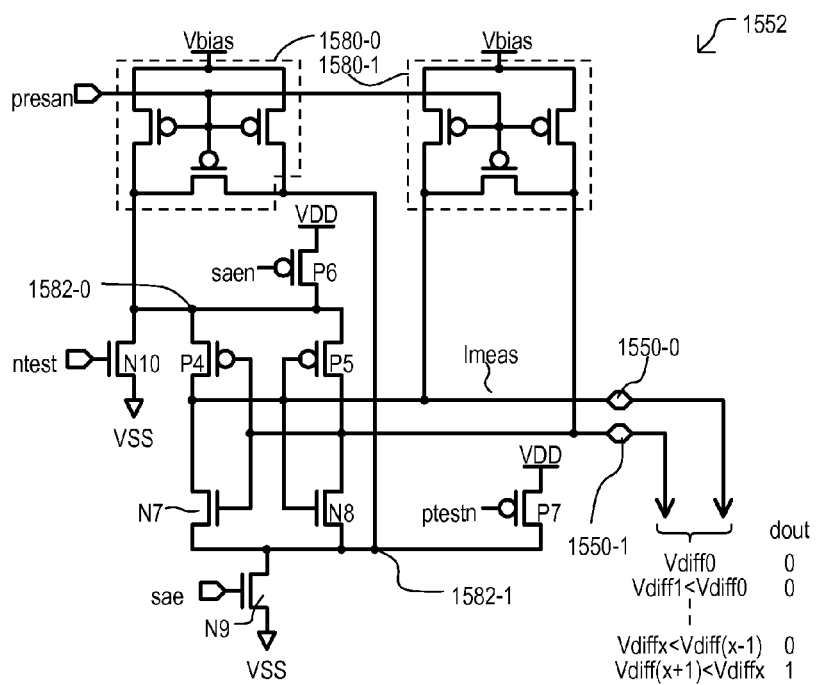

Referring to FIG. 15A to 15C, a sense amplifier (SA) 1552 according to an embodiment is shown in schematic diagrams. In one embodiment, SA 1552 can be that shown as 1332 in FIG. 13.

SA 1552 can include SA precharge circuits 1580-0/1, p-channel sense transistors P4/P5 and n-channel sense transistors N7/N8 cross-coupled between sense nodes 1550-0/1, a first enable transistor P6 coupled between a first enable node 1582-0 and a high power supply node VDD, a second enable transistor N9 coupled between a second enable node 1582-1 and a low power supply voltage VSS, a first test transistor N10 coupled between first enable node 1582-0 and a low power supply voltage VSS, and a second test transistor P7 coupled between second enable node 1582-1 and a high power supply voltage VDD.

SA precharge circuits 1580-0/1 can be commonly controlled according to signal presan. When signal presan is active (low), SA precharge circuits 1580-0/1 can precharge sense nodes 1550-0/1 and enable nodes 1582-0/1 to a SA precharge voltage (Vbias). Enable transistor P6 can be controlled according to signal saen to connect or isolate first enable node 1582-0 from supply voltage VDD. Similarly, enable transistor N9 can be controlled according to signal sae to connect or isolate second enable node 1582-1 from supply voltage VSS. Test transistor N10 can be controlled according to signal ntest to disable sense transistors P4/P5 and enable the testing of sense transistor N7 or N8 by coupling first enable node 1582-0 to VSS. Test transistor P7 can be controlled according to signal ptestn to disable sense transistors N7/N8 and enable the testing of sense transistor P4 or P5 by coupling second enable node 1582-1 to VDD.

Having described various sections of an IC device (i.e., FIGS. 13 to 15C) that can enable a testing of sense amplifier transistors, various modes of operation for such a device will now be described with reference to FIG. 16 in conjunction with FIGS. 13 to 15C.

Figures 16, 17:
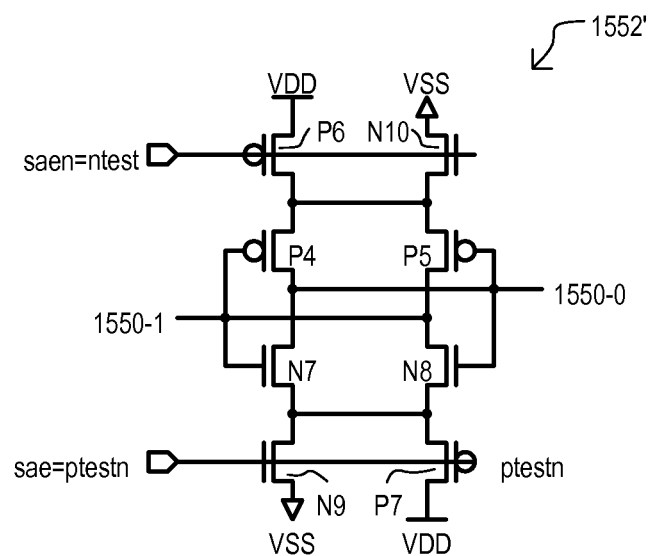
FIG. 16 is a table showing control signals for various modes of operation for a device like that of FIG. 13, according to an embodiment.
FIG. 17 is a diagram showing a sense amplifier layout according to an embodiment.

FIG. 16 is a table showing six different modes of operation for an IC device like that shown in FIGS. 13 to 15C. FIG. 16 shows logic values for the various control signals of an IC device for each corresponding mode. The modes include: "Read" in which data can be read from the IC device; "Write" in which data can be written into the IC device; "DBTA" in which transistors within a memory array can be tested via bit lines; "DSTAN" in which n-channel transistors in a sense amplifier can be tested; "DSTAP" in which p-channel transistors in a sense amplifier can be tested; and "Offset" in which an offset voltage of a sense amplifier can be tested.

Referring now to FIG. 16 in conjunction with FIGS. 13, 14 and 15A, in a Read mode, dbsel=0 disabling test elements within test section 1302, wenable=0 disabling write operations, and ntest=0/ptestn=1 disabling test devices within SA 1352/1552. When a selected memory cell is accessed, other control signals can pulse. Such transitions are shown by values separated with a slash, and represent first transitions in an active read cycle operation. Sense amplifiers are normally off when unselected, but for the selected locations sae and saen transition to the "on" state (0/1 for sae and 1/0 for saen). Precharge signals presan and prebitn are normally "on" in the unselected locations (keeping the unselected bit lines and unselected sense amps precharged), but transition to "off" 0/1 when selected for the read operation. Turning off precharge circuits (e.g., 1476-0/1, 1580-0/1) can enable a small signal to develop between bit lines (BL/BLN) without contention with the precharge circuits. Column select csel is normally off, but transitions to "on" 0/1 at the beginning of a read cycle (cseln is understood to be the complement of csel). The SA 1352 can be activated by sae (0/1) and saen (1/0) to amplify the small signal, thereby driving sense nodes 1350-0/1 to opposing voltages. Afterward, read enable signal can be activated (renable 0/1), and I/O section 1374 can drive read data on dout.

Referring again to FIG. 16 in conjunction with FIGS. 13, 14 and 15A, in a Write mode, dbsel=0, and ntest=0/ptestn=1 as in the Read mode. Further, renable=0, disabling read amplifiers in I/O section 1374. When a selected memory cell is written, signals can pulse as shown in FIG. 16. In particular, precharge signals presan and prebitn are normally "on" in the unselected locations (keeping the bit lines and SAs precharged), but transition to "off" 0/1 for the selected write location to allow the bit lines to be written to full complementary levels without contention with the precharge circuits. SA 1352 can be disabled with sae=0, saen=1. Column Select csel is normally off, but in a write mode can transition to "on" 0/1 at the beginning of the write cycle. A write enable signal can be activated (wenable 0/1), and data at din can be driven on sense nodes 1350-0/1 and bit lines of the written memory cell through a column MUX/precharge section 1332.

Referring again to FIG. 16 in conjunction with FIGS. 13, 14 and 15A, in a DBTA mode, an IC device 1300 can operate in a DC mode, where timing clocks can be stopped and control signals can have either an "on" or "off" state. In a DBTA mode, individual transistors within a memory array can be tested. Such testing, according to very particular embodiments, is shown in FIGS. 11A to 11D. Column select signal csel can have an enable state (csel=1), coupling bit lines (BL/BLN) to sense nodes 1350-0/1. SA 1352 can be disabled (sae=0 and saen=1). In addition, in order to more fully remove SA 1352 from a test path, test signals can be driven to active levels (ntest=1 and ptestn=0), thereby disabling cross-coupled transistors within SA 1352. Precharge circuits for both bit lines 1476-0/1 and the SA nodes 1550-01/can also disabled, to not interfere with the testing. Signal dbsel can be active (dbsel=1), enabling test elements within test section 1302 to provide high fidelity (i.e., low leakage current) test signal paths to transistors within a memory cell being tested. Signals renable and wenable can both be disabled.

Referring once again to FIG. 16 in conjunction with FIGS. 13, 14 and 15A, in a DSTAN mode, an IC device 1300 can also operate in a DC mode. In a DSTAN mode, n-channel devices within SA 1352 can be tested. Signal csel is inactive (csel=0), isolating bit lines BL/BLN from an SA 1352, and bit line precharge circuits 1476-0/1 can be disabled (prebitn=1).

If more than one bit line BL/BLN is coupled to the SA 1352 by parallel multiplexers, such as the column select circuits 1478-0 to 3 (FIG. 14), then all of the column select circuits can be deselected in this mode. Write amplifiers and read amplifiers in I/O section 1374 can be disabled (renable=0, wenable=0). Test elements within test section 1302 can be enabled (dbsel=1) to provide high fidelity test paths to SA 1352.

FIG. 15A shows a SA 1552 in a DSTAN mode. Enable device P6 can be disabled (saen=1), while first test device N10 can be enabled (ntest=1), driving the sources of cross-coupled p-channel sense transistors P4/P5 to VSS, disabling such transistors. Enable device N9 can be enabled (sae=1), and test device P7 can be disabled (ptestn=1). SA precharge circuits 1580-0/1 can be disabled (presan=1). The particular embodiment of FIG. 15A shows a testing of transistor N7. In such a test, sense node 1550-0 can be driven (via a test element) to a voltage less than a threshold voltage of the other n-channel transistor (i.e., Vtn of N8). In one very particular embodiment, such a level can be about 200 mV. The other sense node 1550-1 can be swept from 0 to VDD (or at least to a level significantly higher than the Vtn of N8) via another test element. A current (Imeas) flowing at sense node 1550-0 can be monitored to give current-to-voltage (IN) characteristics (and thus the Vtn) of N7 in a linear mode of operation. To test n-channel transistor N8, voltages applied to sense nodes 1550-0/1 can be reversed.

Referring now to FIG. 16 in conjunction with FIGS. 13, 14 and 15B, in a DSTAP mode, an IC device 1300 can also operate in a DC mode. Signals csel, prebitn, renable, wenable, and dbsel can have the same values as the DSTAN mode.

FIG. 15B shows a SA 1552 in a DSTAP mode. Enable device N9 can be disabled (sae=0), while second test device P7 can be enabled (ptestn=0), driving the sources of cross-coupled n-channel sense transistors N7/N8 to VDD, disabling such transistors. Enable device P6 can be enabled (saen=0), and test device N10 can be disabled (ntestn=0). SA precharge circuits 1580-0/1 can be disabled (presan=1). The particular embodiment of FIG. 15B shows a testing of transistor P4. In such a test, sense node 1550-0 can be driven (via a test element) to a voltage less than a threshold voltage of the other p-channel transistor (i.e., Vtp of P5). In one very particular embodiment, such a level can be about VDD-200 mV. The other sense node 1550-1 can be swept from VDD to 0 (or at least to a level significantly lower than Vtp of P5) via another test element. A current (Imeas) flowing at sense node 1550-0 can be monitored to give current-to-voltage (IN) characteristics (and thus the Vtp) of P4 in a linear mode of operation. To test p-channel transistor P5, voltages applied to sense nodes 1550-0/1 can be reversed.

Referring now to FIG. 16 in conjunction with FIGS. 13, 14 and 15C, in an Offset mode, an IC device 1300 can operate in an AC mode of operation, with system clocks running. However, unlike a Read or Write mode, SA 1352 can be controlled through test section 1302. In an Offset mode, an offset of cross-coupled n- and p-channel transistors (i.e., P4/P5, N7/N8) inside SA 1352 can be tested.

Signal csel can be disabled (csel=0), isolating bit lines BL/BLN from sense nodes 1350-0/1. In the embodiment shown, prebitn=1, disabling bit line precharge circuits 1476-0/1. Signal dbsel can be active (dbsel=1) enabling test elements within test section 1302. In addition, wenable=0, disabling write amplifiers within I/O section 1374. However, renable=1, enabling I/O section 1374 to drive dout based on voltages between sense nodes 1350-0/1.

FIG. 15C shows SA 1552 in an Offset mode that can be used to measure the as-fabricated sense amplifier offset. Test transistors P7, N10 can be disabled (ntest=0, ptestn=1). SA precharge circuits 1580-0/1 can also be disabled (presan=1). Enable transistors P6 and N9 can be activated by pulsing saen (I/O) and sae (0/1), as in a read operation. In an Offset mode, test elements within test section 1302 can apply a sequence of differential voltages to sense nodes 1350-0/1. An Offset test can begin with a reasonably large differential across sense nodes 1350-0/1 (i.e., a differential know to be greater than any offset voltage of the SA 1352). An SA 1352 can be activated to generate an output value (e.g., dout=0) in response to the differential voltage. Such actions can be repeated, gradually reducing (and if necessary reversing the polarity of) the differential voltage until a change in the output value occurs (dout=1). According to one embodiment, the differential voltage at which the output value switches can be determined to be the offset voltage of the SA 1352. In an alternative embodiment, the offset voltage of the SA 1352 is determined by performing a binary search of the differential voltages to sense nodes 1350-0/1.

FIG. 17 shows an alternate configuration for a sense amplifier 1552' like that shown in FIGS. 15A to 15C. In FIG. 17, signals saen and ntest can be the same. Similarly, sae and ptestn can be the same. In such an arrangement, signal routing can be advantageously compact.

While FIGS. 15A to 15C shows test modes of operation for one particular sense amplifier circuit, it is understood that other embodiments can include any other suitable sense amplifier circuits. Two of many possible alternate embodiments for testing different sense amplifier circuits will now be described.

Figure 18:
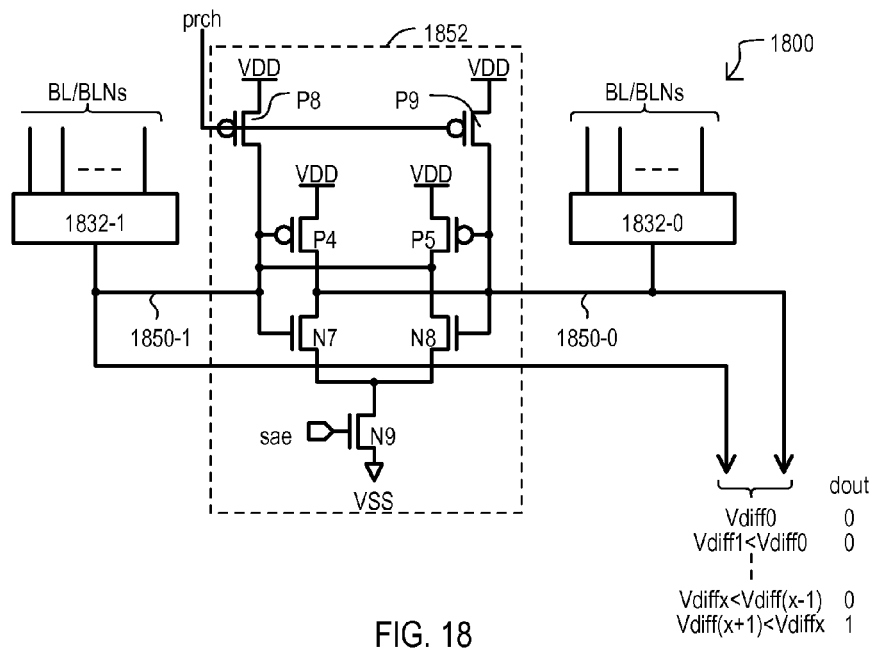
FIG. 18 is a block schematic diagram of an integrated circuit device according to a further embodiment.

FIG. 18 shows an IC device 1800 having a "regenerative" type SA 1852. IC device 1800 can include column select circuits 1832-0/1 which can couple bit lines (BL/BLNs) to sense nodes 1850-0/1 as described for embodiments herein, or equivalents. Sense nodes 1850-0/1 can be coupled to test outputs (not shown) via test elements (not shown). SA 1852 can include cross-coupled p-channel and n-channel transistors (P4/P5, N7/N8) and an enable transistor N9, as described for other embodiments. In addition, SA 1852 can include precharge transistors P8/P9.

An Offset test for IC device 1800 can start with precharge devices P8/P9 being disabled (prch=1). A reasonably large differential voltage can be generated across sense nodes 1850-0/1. SA 1852 can be activated (saen=0/1 pulse) to generate an output value. Such actions can be repeated with reduced differential values, as described for FIG. 15C until an output value changes. In alternative embodiments, a linear search or a binary search of the differential voltage can be performed to determine the offset voltage.

Figure 19:
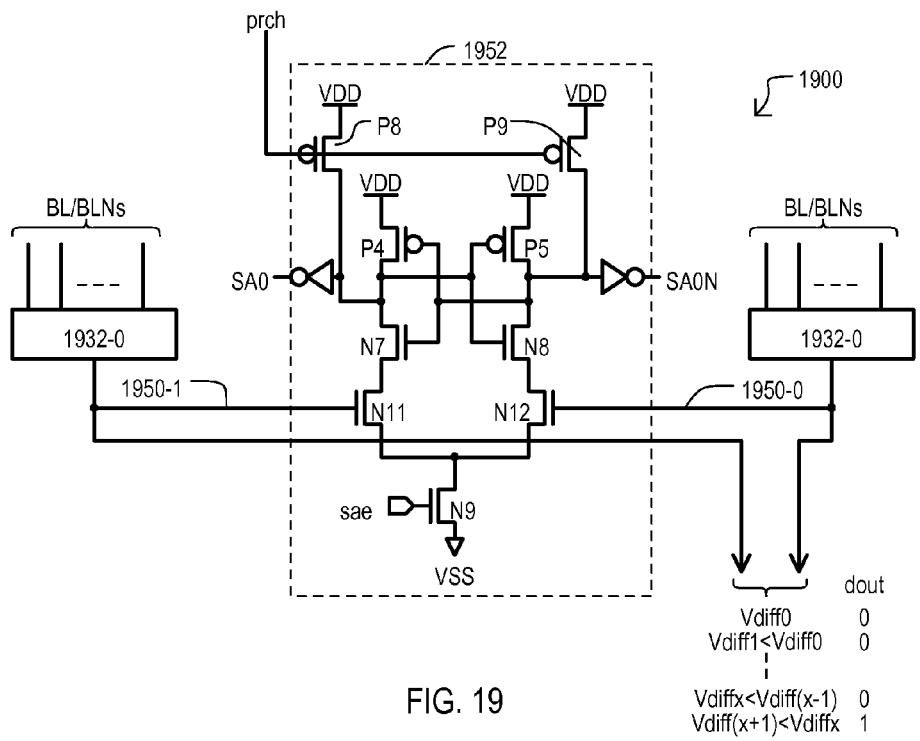
FIG. 19 is a block schematic diagram of an integrated circuit device according to another embodiment.

FIG. 19 shows an IC device 1900 having an analog comparator type SA 1952. IC device 1900 can include sections like those of FIG. 18. In addition, SA 1952 can include differential input transistors N11/N12 having gates coupled to sense nodes 1950-0/1, and source-drain paths coupled between transistors N7/N8 and enable transistor N9.

An Offset test for IC device 1900 can occur in a like fashion to that of FIG. 18. Precharge devices P8/P9 can be disabled (prch=1), and a reasonably large differential voltage can be generated across sense nodes 1950-0/1. SA 1952 can be activated (saen=0/1 pulse) to generate an output value (SAO/SAON). Such actions can be repeated with reduced differential values, as described for FIG. 15C until an output value changes.

Integrated circuit devices according to embodiments shown herein, and equivalents, may provide improved characterization of device elements by providing high fidelity test paths to various internal nodes of the device.

In very particular SRAM embodiments, transistors within individual memory cells can be characterized. In addition or alternatively, transistors within sense amplifiers and/or a sense amplifier offset voltage can be accurately characterized. Such data can enable circuits and threshold levels to be optimized to actual transistor response, as opposed to being constructed with "guard-band" responses designed to accommodate a wide range of variation in transistor and/or SA response.

In alternative embodiments, the test elements 102 can be used for measurement and characterization of analog circuits, such as a comparator in a flash analog to digital converter. Thus, the various embodiments and test operation described above can also be used to determine as-fabricated offsets in such analog circuits.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit device, comprising:
   a plurality of test elements, each comprising
      at least one first switch coupled between a node within a tested section and an intermediate node,
      a test switch coupled between the intermediate node and a forced voltage node, and
      a second switch coupled between the intermediate node and an output node; wherein
      the forced voltage node is selectively coupled to receive a forced voltage substantially the same as a test voltage applied to the output node.

2. The integrated circuit device of claim 1, wherein:
   each test element of the plurality of test elements is operable in a first mode, the at least one first switch being coupled to provide a low impedance path and the test switch being coupled to provide a high impedance path in the first mode; and
   each test element of the plurality of test elements is operable in a second mode, the at least one first switch being coupled to provide a high impedance path and the test switch being coupled to provide a low impedance path in the second mode.

3. The integrated circuit device of claim 1, wherein:
   the at least one first switch, test switch, and second switch each comprise transistors of different conductivity types having current paths arranged in parallel with one another.

4. The integrated circuit device of claim 1, wherein:
   the at least one first switch, test switch, and second switch each comprise at least one transistor; and
   each test element fits within no more than three transistor pitches.

5. The integrated circuit device of claim 1, wherein:
   the at least one first switch includes a plurality of first parallel switches, each first parallel switch being coupled between a node of the integrated circuit and the intermediate node;
   each test element of the plurality of test elements is operable in a first mode, the test switch being coupled to provide a high impedance path in the first mode, at least one parallel switch of the plurality of first parallel switches being coupled to provide a low impedance path in the first mode, and the first parallel switches other than the at least one parallel switch being coupled to provide a high impedance path in the first mode; and
   each test element of the plurality of test elements is operable in a second mode, the test switch being coupled to provide a low impedance path and all of the first parallel switches of the test element being coupled to provide a high impedance state in the second mode.

6. The integrated circuit device of claim 1, wherein:
   the tested section comprises a memory array;
   the test elements are formed in a same integrated circuit substrate having a plurality of conductive input/output (I/O) pads formed thereon for making electrical connections to the integrated circuit device; and
   the forced voltage node is coupled to at least one of the I/O pads.

7. The integrated circuit device of claim 1, further including:
   the tested section comprises a memory array; and
   a plurality of column multiplexer (MUX) circuits coupled between the test elements and corresponding bit lines of the memory array, each column MUX selectively coupling one of a plurality of bit lines to a test element in response to column address data.

8. The integrated circuit device of claim 1, further including:
   the tested section comprises a memory array;
   a plurality of sense amplifiers configured to amplify electrical signals on bit lines of the memory array to generate read output data; and
   each test element further includes the at least one first switch being coupled to the corresponding bit line via a sense amplifier input.

9. The integrated circuit device of claim 1, further including:
   the tested section comprises a memory array formed from a plurality of banks, each bank including bit lines;
   each test element couples the corresponding bit line to a bank input/output (I/O) node of its corresponding bank; and
   a bank select circuit corresponding to each bank that couples the bank I/O node to the output node.

10. The integrated circuit device of claim 2, further including:
   the tested section comprises a memory array having a plurality of memory cells coupled to bit lines, each memory cell including
      a first pair of pull-up transistors cross-coupled between two storage nodes, and
      a pair of access transistors that couple each storage node to a different bit line; and a word line driver circuit coupled to enable the access transistors in a test mode;

a first one of the test elements is configured to apply a test voltage on a first bit line to a control terminal of one of the first pull-up transistors through a first of the access transistors in the test mode, the first one of the test elements being configured to be operable in the first mode; and a second one of the test elements is configured to enable a current drawn by the one pull-up transistor to flow through a second bit line and a second of the access transistors in the test mode, the second one of the test elements being configured to be operable in the first mode.

11. The integrated circuit device of claim 10, further including:

each memory cell further includes a second pair of pull-down transistors, cross-coupled between the two storage nodes and source node; and a source driver circuit that drives the source node to the test voltage in the test mode.

12. The integrated circuit device of claim 1, wherein:

the tested section comprises a memory array having a plurality of memory cells coupled to bit lines, each memory cell including
  a pair of pull-up transistors cross-coupled between two storage nodes, and
  a pair of access transistors that couple each storage node to a different bit line; and a word line driver circuit coupled to apply a test voltage to the control terminals of the access transistors in a test mode;

a first one of the test elements is configured to apply an enable voltage to a control terminal of a first of the pull-up transistors through a first bit line and a first of the access transistors in the test mode, the first one of the test elements being configured to be operable in the first mode; and a second one of the test elements is configured to enable a current drawn by a second of the access transistor to flow a second bit line and the first of the latching transistors in the test mode, the second one of the test elements being configured to be operable in the first mode.

13. An integrated circuit device, comprising:

a plurality of test elements, each comprising
  at least one first switch coupled between a node within a memory section and an intermediate node,
  a test switch coupled between the intermediate node and a forced voltage node, and
  a second switch coupled between the intermediate node and an output node; wherein the forced voltage node is selectively coupled to receive a forced voltage substantially the same as a test voltage applied to the output node.

14. The integrated circuit device of claim 13, wherein:

each test element of the plurality of test elements is operable in a first mode, the at least one first switch being coupled to provide a low impedance path and the test switch being coupled to provide a high impedance path in the first mode; and each test element of the plurality of test elements is operable in a second mode, the at least one first switch being coupled to provide a high impedance path and the test switch being coupled to provide a low impedance path in the second mode.

15. The integrated circuit device of claim 13, further including:

the memory section includes a sense amplifier comprising a pair of sense transistors cross-coupled between two sense nodes;

an isolation circuit configured to electrically isolate the sense nodes from bit lines of a memory cell array;

a first one of the test elements is configured to apply a test voltage to a control terminal of one of the sense transistors; and a second one of the test elements is configured to enable a current drawn by the one sense transistor in the test mode.

16. The integrated circuit device of claim 13, wherein:

the memory section includes a sense amplifier configured to drive sense nodes to sense voltages in response to a differential voltage across the sense nodes;

an isolation circuit configured to electrically isolate the sense nodes from bit lines of a memory cell array in an offset test mode;

a read circuit that outputs a read value in response to the sense voltage; and a first and second test elements configured to apply a differential voltage across the two sense nodes.

17. The integrated circuit device of claim 16, further including:

a test circuit configured to provide a sequence of different differential voltages to the first and second test elements in response to read values from the read circuit.

18. The integrated circuit device of claim 13, wherein:

the memory section includes a sense amplifier comprising
  a first pair of sense transistors cross-coupled between two sense nodes,
  a first enable transistor coupled between the first pair of sense transistors and a first power supply node, and
  a first disable transistor coupled between the first pair of sense transistors and a second power supply node; wherein control terminals of the first enable and first disable transistor are commonly coupled to a first sense enable signal.

19. The integrated circuit device of claim 18, wherein:

the sense amplifier further includes
  a second pair of sense transistors cross-coupled between the two sense nodes and of a different conductivity type than the first pair of sense transistors,
  a second enable transistor coupled between the second pair of sense transistors and the second power supply node, and
  a first disable transistor coupled between the second pair of sense transistors and the first power supply node; wherein control terminals of the second enable and second disable transistor are commonly coupled to a second sense enable signal that is the inverse of the first sense enable signal.

20. The integrated circuit of claim 13, wherein:

the memory section includes a sense amplifier comprising
  a first transistor having a control terminal coupled to a first of the sense nodes, and
  a second transistor having a control terminal coupled to a second of the sense nodes.

21. The integrated circuit of claim 13, wherein:

a memory section comprises a plurality of memory cells, each memory cell including
  a first pair of pull-up transistors cross-coupled between two storage nodes, and
  a pair of access transistors that couple each storage node to a different bit line; and a word line driver circuit coupled to enable the access transistors in a test mode;

the first one of the test elements is further configured to apply a test voltage on a first bit line to a control terminal of one of the first pull-up transistors through a first of the access transistors in a cell test mode; and the second one of the test elements is configured to enable a current drawn by the one pull-up transistor to flow through a second bit line and a second of the access transistors in the cell test mode.

22. A method, comprising:
in a direct access mode,
enabling a first signal path between a first output node and a tested section that includes an intermediate node; and
in a low leakage cutoff mode,
enabling at least a second signal path between the first output node and the tested section,
disabling the first signal path between the tested section and the intermediate node and between the intermediate node and the first output node, and
driving the first output node and the intermediate node to substantially a same first test voltage.

23. The method of claim 22, further including:
enabling at least a second path includes
enabling a first test signal path from the first output node to the tested section, and
enabling a second test signal path from a second output node to the tested section.

24. The method of claim 23, further including:
maintaining the first output node at the first test voltage;
varying a voltage at the second output node; and
measuring a current flowing through the first output node.

25. The method of claim 24, wherein:
the tested section is a memory section comprising a plurality of memory cells;
the first test signal path includes a first bit line coupled to a memory cell and a control terminal of a transistor under test (TUT) within the memory cell; and
the second signal path includes a second bit line and a current path of the TUT.

26. The method of claim 25, wherein:
each memory cell comprises
a pair of pull-up transistors cross-coupled between storage nodes,
a pair of pull-down transistors cross-coupled between the storage nodes;
access transistors coupled between the storage nodes and the first and second bit lines; and
the TUT is selected from one of the access transistors, one of the pull-up transistors, or one of the pull-down transistors.

27. The method of claim 24, wherein:
the tested section comprises a memory section that includes a first sense node of sense amplifier and a control terminal of a transistor under test (TUT) within the sense amplifier; and
the second signal path includes a second sense node of the sense amplifier and a current path of the TUT.

28. The method of claim 27, wherein:
the sense amplifier comprises at least a first pair of sense transistors cross-coupled between the sense nodes; and
the TUT is one of the sense transistors.

29. The method of claim 27, further including:
isolating the sense nodes from bit lines of the memory section.

30. The method of claim 23, further including:
the tested section comprises a memory section that includes a sense amplifier;
the first test signal path is coupled to a first sense node of a sense amplifier;
the second test signal path is coupled to a second sense node of the sense amplifier;
applying a differential voltage between the first output node and the second output node; and
activating the sense amplifier to generate a sensed data value.

31. The method of claim 30, further including:
altering the applied differential voltage in response to the sensed data value.

* * * * *